(12) United States Patent
Kawano et al.

(10) Patent No.: US 9,429,632 B2
(45) Date of Patent: Aug. 30, 2016

(54) MAGNETIC POSITION DETECTION DEVICE

(75) Inventors: Yuji Kawano, Chiyoda-ku (JP); Manabu Tsukamoto, Chiyoda-ku (JP); Hiroshi Kobayashi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 275 days.

(21) Appl. No.: 14/368,675

(22) PCT Filed: Apr. 26, 2012

(86) PCT No.: PCT/JP2012/061188
§ 371 (c)(1),
(2), (4) Date: Jun. 25, 2014

(87) PCT Pub. No.: WO2013/161027
PCT Pub. Date: Oct. 31, 2013

(65) Prior Publication Data
US 2014/0354270 A1 Dec. 4, 2014

(51) Int. Cl.
*G01R 33/09* (2006.01)
*G01B 7/00* (2006.01)
*G01D 5/245* (2006.01)
*G01B 7/30* (2006.01)

(52) U.S. Cl.
CPC ............. *G01R 33/09* (2013.01); *G01B 7/003* (2013.01); *G01B 7/30* (2013.01); *G01D 5/2451* (2013.01)

(58) Field of Classification Search
CPC .... G01R 33/005; G01R 33/06; G01R 33/09; G01R 33/091; G01R 33/093; G01R 33/098
USPC ........... 324/207.21, 207.25, 207.11, 207.12, 324/207.13, 207.14, 244, 252, 260, 262; 257/E43.004; 361/139; 338/32 R
See application file for complete search history.

(56) References Cited

U.S. PATENT DOCUMENTS 5,561,368 A    10/1996    Dovek et al.
5,574,364 A * 11/1996    Kajimoto ............. F02D 41/009
                                                       324/207.12

(Continued)

FOREIGN PATENT DOCUMENTS

JP            3017061 B2     3/2000
WO      2009/099054 A1    8/2009

OTHER PUBLICATIONS

International Search Report of PCT/JP2012/061188 dated Jul. 10, 2012.

*Primary Examiner* — Jermele M Hollington
*Assistant Examiner* — Robert P Alejnikov, Jr.
(74) *Attorney, Agent, or Firm* — Sughrue Mion, PLLC

(57) ABSTRACT

A distortion of a signal of a magnetic position detection device is reduced so that precise position information at a high degree of accuracy can be obtained. The magnetic position detection device 100 includes a magnetic movable body 10, a bridge circuit 20, a correction circuit 30, and a detection circuit 40. The magnetic movable body 10 is magnetized so that N-poles and S-poles alternately appear and has a region in which distances between the N-poles and the S-poles are constant. The bridge circuit 20 is formed of first, second, third, and fourth field detection portions 2R1, 2R2, 2R3, and 2R4. The correction circuit 30 is formed of fifth and sixth field detection portions 2R5 and 2R6. The detection circuit 40 detects a position of the magnetic movable body 10 on the basis of a differential output Vout of the bridge circuit.

13 Claims, 26 Drawing Sheets

(56) References Cited

U.S. PATENT DOCUMENTS 6,566,862 B1 * 5/2003 Goto .................... G01D 3/0365
324/207.16

7,400,137 B1 * 7/2008 Meguro ............... G01R 33/093
324/207.21

2010/0321008 A1 12/2010 Mita et al.

* cited by examiner

FIRST EMBODIMENT

COMPARATIVE EMBODIMENT OF FIRST EMBODIMENT

SECOND EMBODIMENT

EMBODIMENT WITHOUT CORRECTION CIRCUIT OF SECOND EMBODIMENT

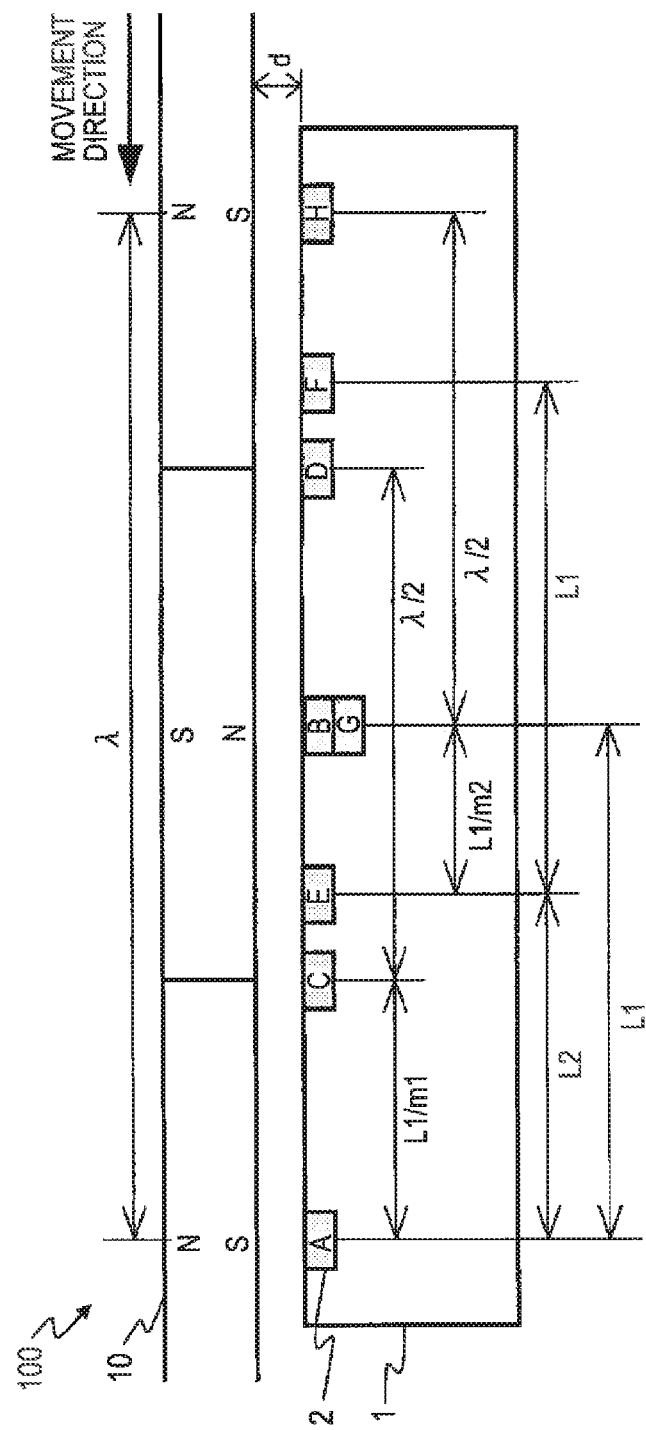

n1=3,n2=2,m1=3,m2=2 n1=2,n2=3,m1=2,m2=3 n1=2,n2=3,m1=2,m2=2

THIRD EMBODIMENT

EMBODIMENT WITHOUT CORRECTION CIRCUITS OF THIRD EMBODIMENT

MAGNETIC POSITION DETECTION DEVICE

CROSS REFERENCE TO RELATED APPLICATIONS

This is a National Stage of International Application No. PCT/JP2012/061188 filed Apr. 26, 2012, the content of all of which is incorporated herein by reference in its entirety.

TECHNICAL FIELD

The present invention relates to a magnetic position detection device that magnetically detects a movement of a magnetic movable body.

BACKGROUND ART

There is a detection device formed of an electromagnetic conversion element and a magnet as a device magnetically detecting a movement of a magnetic movable body. The electromagnetic conversion element referred to herein means an element having an electrical resistance value that varies with an applied field, such as an MR (Magneto-Resistance) element. Because a field applied to the electromagnetic conversion element varies with a movement of the magnetic movable body, the movement of the magnetic movable body can be detected as a variance of the electrical resistance value.

For example, a field sensor of PTL 1 discloses a spin-valve MR element as the electromagnetic conversion element. The spin-valve MR element has ferromagnetic first and second thin-film layers separated by a non-magnetic thin-film layer. A magnetization direction of the ferromagnetic second thin-film layer is fixed (magnetization fixed layer). The magnetization is fixed by means of bringing an antiferromagnetic thin-film layer (pinning layer) into direct contact with the magnetization fixed layer. Meanwhile, a magnetization direction of the ferromagnetic first thin-film layer varies freely with an applied field (magnetization free layer).

In comparison with an AMR (Anisotropic Magneto-Resistance) element as a typical MR element, the spin-valve MR element has a large variance of the electrical resistance value (a magneto-resistance change rate, namely, an MR ratio) and therefore highly sensitive detection is made possible. The spin-valve MR element includes a GMR (Giant Magneto-Resistance) element and a TMR (tunneling Magneto-Resistance) element. In particular, the TMR element is receiving attention recently because of its large MR ratio.

FIG. 20 shows a variance of an electrical resistance value of a spin-valve MR element 3. The electrical resistance value of the spin-valve MR element 3 varies with an angle yielded between a magnetization direction of a magnetization fixed layer 3b and a magnetization direction of a magnetization free layer 3a. Hence, when a direction of a field applied to the spin-valve MR element 3 rotates, a variance of the electrical resistance value of the spin-valve MR element 3 appears in the form of a cosine wave or a sine wave.

FIGS. 21A and 21B are configuration views showing an example of a magnetic position detection device in the related art. An operating principle underlying one example of the magnetic position detection device using spin-valve MR elements 3 as shown in FIGS. 21A and 21B will now be described. A magnetic movable body 10 is magnetized so that N-poles and S-poles alternately appear and has a region in which distances between the N-poles and the S-poles are constant. The spin-valve MR elements 3 are located in a region A and a region B of field detection portions 2 a distance d away from the magnetic movable body 10. A distance between the regions A and B is given as λ/2 with respect to a magnetization pitch (distance between an N-pole and another N-pole) λ of the magnetic movable body 10. Also, field detection portions Ra1 and Ra2 are located in the region A and field detection portions Rb1 and Rb2 are located in the region B. The field detection portions Ra1, Ra2, Rb1, and Rb2 are set so that magnetization directions of the magnetization fixed layers 3b of the spin-valve MR elements 3 forming the respective field detection portions are all in a same direction with respect to a movement direction of the magnetic movable body 10 and connected so as to form a bridge circuit 20 as is shown in FIG. 22.

When a direction of the field applied to the spin-valve MR elements 3 rotates in association with a movement (rotation) of the magnetic movable body 10, the electrical resistance values of the spin-valve MR elements 3 vary as is shown in FIG. 20. Hence, a differential output Vout of the bridge circuit 20 of the device shown in FIG. 22 forms a waveform close to a cosine wave or a sine wave as is shown in FIG. 23. A movement distance s (rotational angle β) of the magnetic movable body 10 can be calculated on the assumption that a differential output Vout of the bridge circuit forms a cosine wave or a sine wave. Referring to FIG. 22, numeral 40 is a detection circuit, numeral 41 is a differential amplifier circuit, and numeral 42 is a signal processing circuit.

CITATION LIST

Patent Literature

PTL 1: Japanese Patent No. 3017061
PTL 2: WO2009/099054

SUMMARY OF INVENTION

Technical Problem

In order to increase a degree of detection accuracy in the magnetic position detection device described above, it is preferable that a differential output Vout of the bridge circuit in the device has a large amplitude and a small distortion from a cosine wave or a sine wave. It is preferable to apply TMR elements having a large MR ratio to increase the amplitude of a differential output Vout of the bridge circuit. The spin-valve MR element 3 has features that a distortion of the waveform of the electrical resistance value largely depends on properties of the magnetization free layer 3a because of its operating principle, and therefore desired properties can be obtained by optimizing a material of the magnetization free layer 3a and a substrate of the magnetization free layer 3a, which relate to magnetization of the magnetization free layer 3a. The TMR elements, however, have these features as well.

On the other hand, the TMR elements have a problem of their own. The TMR elements show voltage dependency of an MR ratio as shown in FIG. 24. Because an MR ratio of the TMR elements decreases with an increase of an applied voltage, when the bridge circuit 20 is formed of the TMR elements, an MR ratio varies with a variance of a voltage applied to the respective elements. Such a variance appears as a distortion of a waveform of a differential output Vout of the bridge circuit.

One of measures to solve this problem may be to lower a voltage applied to one element by connecting multiple elements among the TMR elements forming the bridge circuit 20. However, the number of connected elements is a factor that determines the electrical resistance value of the bridge circuit 20 and the number is limited in actual use. Hence, a further measure is required apart from the measure adopting the method described above.

The magnetic position detection device described above also has a problem of its own, that is, influences of a distribution of a field generated by the magnetic movable body 10 to the waveform of a differential output Vout of the bridge circuit. In operations of the device shown in FIGS. 21A and 21B, let Q be strength of a field H generated by the magnetic movable body 10 in a movement direction (direction x of FIG. 21B) and P be strength in a radial direction (direction y of FIG. 21B) at a point a distance d away from the magnetic movable body 10. A phase angle θ between the magnetic poles of the magnetic movable body 10 and the region A of the magnetic detection portion 2 with respect to a movement distance s of the magnetic movable body 10 has a relation expressed as below with an angle α of a field applied to the region A. Equation 1 is as follows:

$\theta = (s/\lambda) \cdot 2\pi$ $Hx = Q \cdot \sin \theta$ $Hy = P \cdot \cos \theta$ $\tan \alpha = (Q/P) \cdot \tan \theta.$ When Q/P=1, the phase angle θ coincides with the applied field angle α. Hence, there is no distortion of the waveform of a differential output Vout of the bridge circuit in the device. On the contrary, when Q/P is not equal to 1 (about 0.5 to 0.9), the phase angle θ and the applied field angle α do not coincide with each other. FIG. 25 shows a relation between the phase angle θ and the applied field angle α, for example, when Q/P=1, 0.7, and 0.5. When Q/P=0.7 and 0.5, because the waveform of the electrical resistance value of the TMR element undergoes distortion, the waveform of a differential output Vout of the bridge circuit undergoes distortion, too, as is shown in FIG. 26.

For example, PTL 2 discloses a measure to solve this problem. A rotational angle detection device disclosed in this reference obtains a signal Vx and a signal Vy by applying analog-to-digital conversion (A-to-D conversion) to strengths of the field detected in a rotational direction and a radial direction, respectively, and makes a correction so that amplitudes of the respective signals become equal by multiplying the signal Vx by a correction coefficient k. According to this device, a distortion is suppressed and a rotational angle at a higher degree of accuracy can be obtained. However, a circuit size is increased by an A-to-D converter, a computation circuit of the coefficient k, a multiplier, and so on.

As has been described, causes of a distortion of the waveform of a differential output Vout of the bridge circuit in the magnetic position detection device described above are voltage dependency of an MR ratio (a decrease of an MR ratio) of the TMR elements and a distribution (Q/P<1) of a field generated by the magnetic movable body 10.

An object of the invention is to provide a magnetic position detection device capable of obtaining precise position information at a high degree of accuracy by reducing a distortion of a signal.

Solution to Problem

A magnetic position detection device of the invention includes a magnetic movable body, a bridge circuit, a correction circuit, and a detection circuit. The magnetic movable body is magnetized so that N-poles and S-poles alternately appear and has a region in which distances between the N-poles and the S-poles are constant. The bridge circuit is formed of first, second, third, and fourth field detection portions. The correction circuit is formed of fifth and sixth field detection portions. The detection circuit detects a position of the magnetic movable body on the basis of a differential output Vout of the bridge circuit. The field detection portions are formed of spin-valve MR elements having electrical resistance values that vary with a change of a field in association with a movement of the magnetic movable body. Magnetization directions of magnetization fixed layers in the respective spin-valve MR elements forming the first through sixth field detection portions are all aligned in a same direction with respect to a movement direction of the magnetic movable body. The first and third field detection portions are located at a detection position in a region A. The second and fourth field detection portions are located at a detection position in a region B. The fifth field detection portion is located at a detection position in a region C. The sixth field detection portion is located at a detection position in a region D. Relations with respect to a constant distance λ between an N-pole and another N-pole or between an S-pole and another S-pole of the magnetic movable body expressed as below are established.

Equation 2 is as follows:

a distance L(A-B) between the detection positions in A and B is expressed as:

$L(A-B) = L = \lambda/n,$ a distance L(A-C) between the detection positions in A and C is expressed as:

$L(A-C) = L/m = \lambda/(mn),$ and a distance L(C-D) between the detection positions in C and D is expressed as:

$L(C-D) = \lambda/2,$ where n is a natural number equal to or greater than 2 and m is a natural number.

Advantages Effects of Invention

According to the magnetic position detection device of the invention, the field detection portions forming the bridge circuit are located so as to reduce a distortion of a waveform of a differential output Vout of the bridge circuit due to a distribution of a field generated by the magnetic movable body. Also, the field detection portions forming the correction circuit are located so as to reduce a distortion of a waveform of a differential output Vout of the bridge circuit due to voltage dependency of an MR ratio of spin-valve MR elements. Hence, position information at a higher degree of accuracy can be obtained.

The foregoing and other objects, features, aspects, and advantages of the present invention will become more apparent from the following detailed description of the present invention when taken in conjunction with the accompanying drawings.

BRIEF DESCRIPTION OF DRAWINGS

FIG. 13 is a plan view showing positions (detection positions) at which to locate field detection portions in a magnetic position detection device of a third embodiment.

DESCRIPTION OF EMBODIMENTS

Hereinafter, embodiments of the invention will be described in detail with reference to the drawings.

Figure 1:
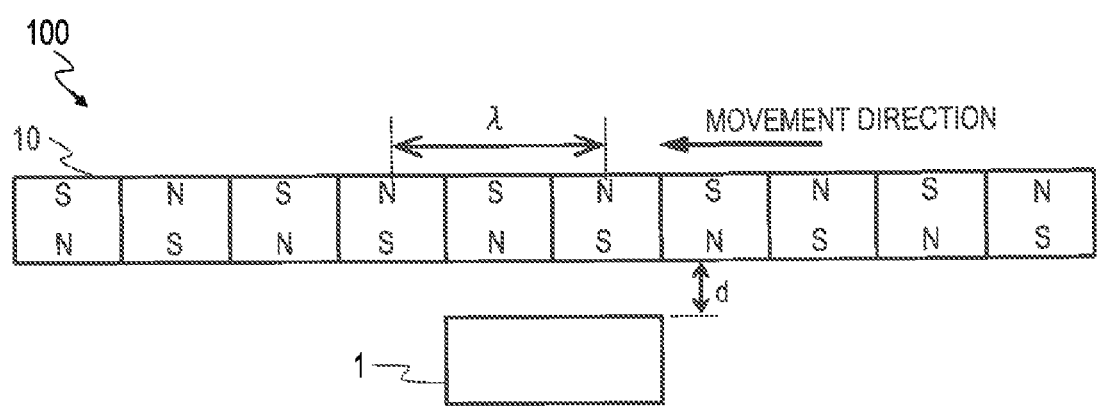
FIG. 1 is a configuration view of a magnetic position detection device according to an embodiment of the invention to show an example of a location with respect to a magnetic movable body.

FIG. 1 is a configuration view showing a typical example of a magnetic position detection device 100 of the invention. The magnetic position detection device 100 includes a magnetic movable body 10 and a field sensor 1. The magnetic movable body 10 is magnetized so that N-poles and S-poles alternately appear on the surface and has a region in which distances between the N-poles and the S-poles are constant. Herein, λ is given as a magnetization pitch (a distance between an N-pole and another N-pole). The field sensor 1 is installed oppositely to the magnetic movable body 10 with a predetermined distance d in between. N-poles and S-poles alternately appear in the magnetic movable body 10 on a surface opposing the field sensor 1 as the magnetic movable body 10 moves.

Figure 2:
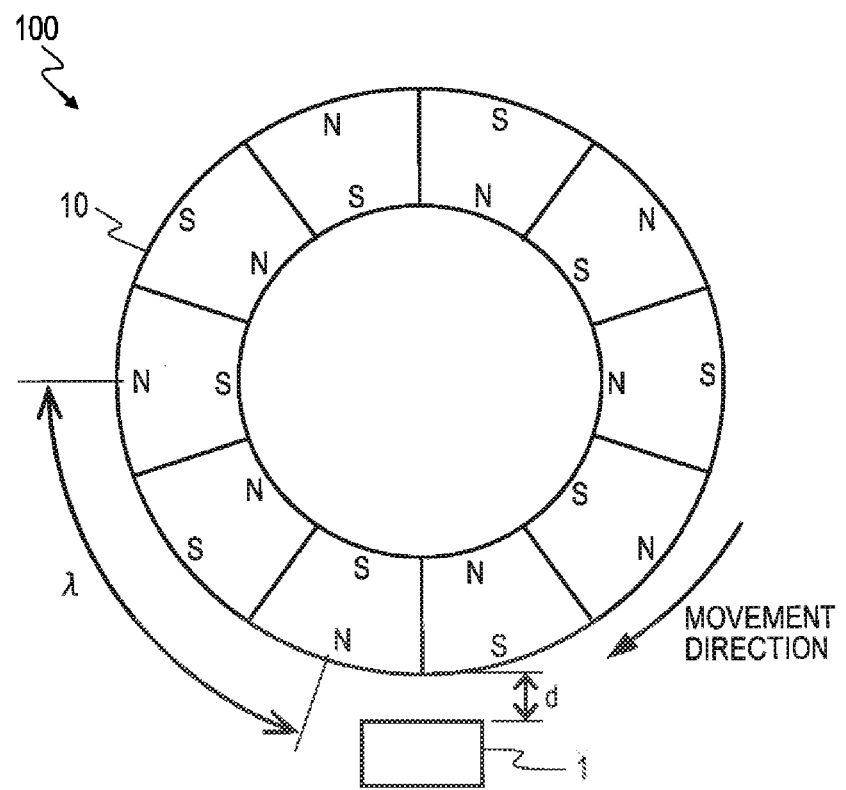
FIG. 2 is a configuration view of another magnetic position detection device according to an embodiment of the invention to show another example of a location with respect to the magnetic movable body.

FIG. 2 shows another typical example of the magnetic position detection device 100 of the invention. This drawing is a configuration view showing another example of the configuration of the magnetic movable body 10 and a location of the field sensor 1 with respect to the magnetic movable body 10. The magnetic movable body 10 has a cylindrical magnet and is magnetized so that N-poles and S-poles alternately appear on a peripheral surface. The magnetic movable body 10 has a region in which distances between the N-poles and the S-poles are constant and has 2i poles (i=5 in the drawing) at magnetization pitches (distance between an N-pole and another N-pole) of λ.

FIG. 1 and FIG. 2 do not have a substantial difference except for a difference in a movement configuration of the magnetic movable body 10. More specifically, the magnetic movable body 10 in FIG. 1 moves linearly in close proximity to the field sensor 1 whereas the magnetic movable body 10 in FIG. 2 rotates about a center shaft of the magnetic movable body 10. However, in the both embodiments, a phase angle θ between the magnetic poles of the magnetic movable body 10 and the field detection portions 2 with respect to a movement distance s of the magnetic movable body 10 has a relation, θ=(s/kA)·2π, as expressed in Equation 1 above. Hence, a description will be given in the following using the configuration of FIG. 1.

Figure 3:
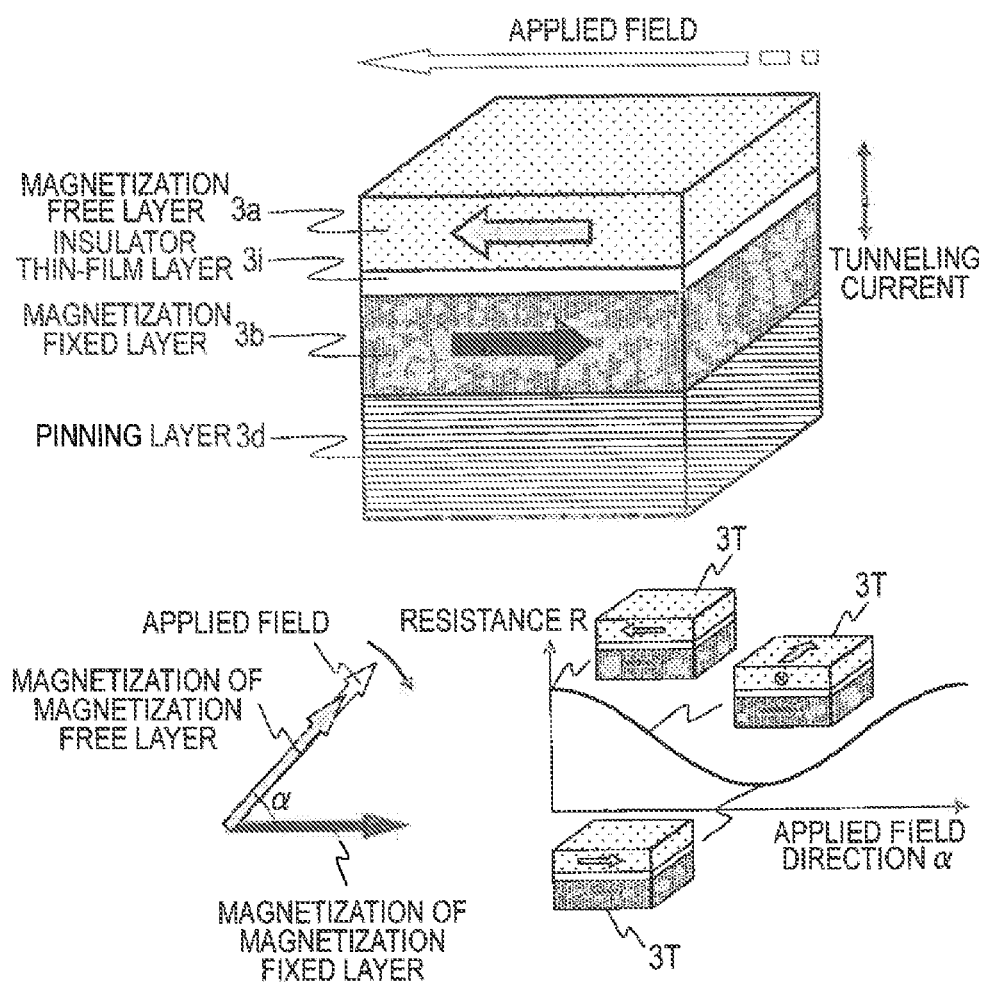
FIG. 3 is a configuration view of a TMR element forming each field detection portion in the magnetic position detection device according to an embodiment of the invention.

FIG. 3 is a configuration view of a TMR element 3T (spin-valve MR element) forming each field detection portion 2 in the magnetic position detection device 100 of the invention. The TMR element 3T is a tunneling magneto-resistance element having ferromagnetic first and second thin-film layers 3a and 3b separated by an insulator thin-film layer 3i (non-magnetic body). A magnetization direction of the ferromagnetic second thin-film layer 3b is fixed (magnetization fixed layer). The magnetization is fixed by means of bringing an anti-ferromagnetic thin-film layer 3d (pinning layer) into direct contact with the magnetization fixed layer 3b. Meanwhile, a magnetization direction of the ferromagnetic first thin-film layer 3a varies freely with an applied field (magnetization free layer). An electrical resistance value of the TMR element 3T varies with an angle yielded between the magnetization direction of the magnetization fixed layer 3b and the magnetization direction of the magnetization free layer 3a. The magnetization directions of the magnetization fixed layers 3b in the invention are all in a same direction with respect to a movement direction of the magnetic movable body 10.

First Embodiment

Figure 4:
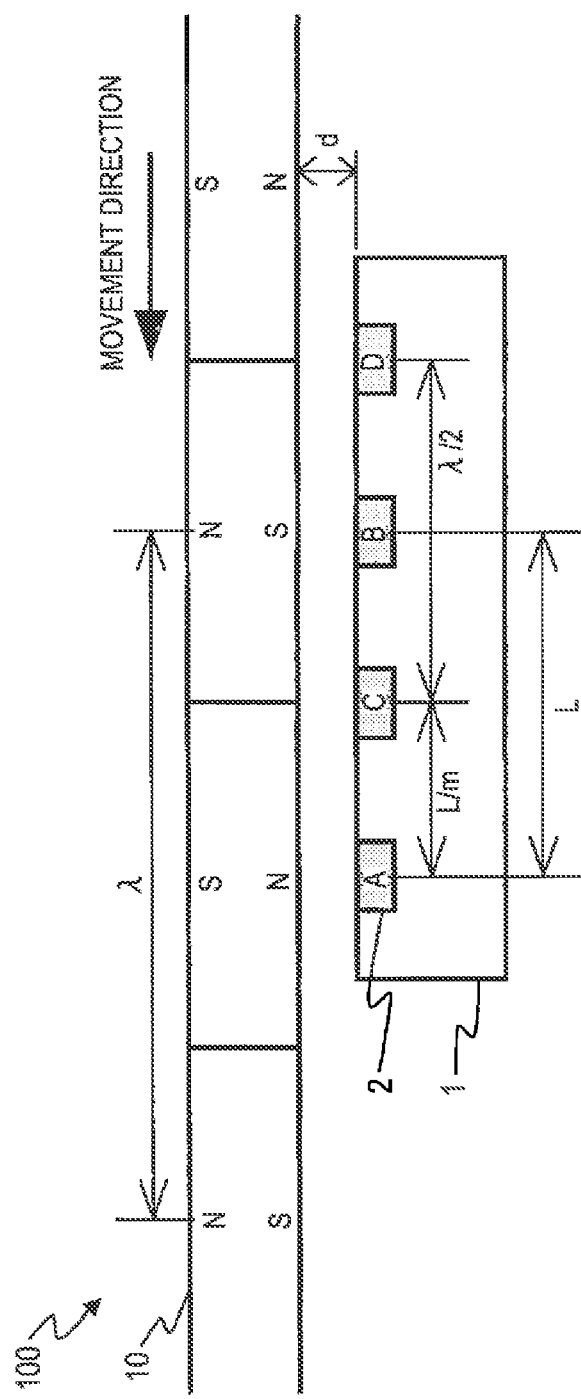
FIG. 4 is a plan view showing positions (detection positions) at which to locate the field detection portions in the magnetic position detection device of a first embodiment.

FIG. 4 shows positions (detection positions) at which to locate field detection portions 2 in the magnetic position detection device 100 of a first embodiment. Four regions, namely, a region A, a region B, a region C, and a region D, are provided as the detection positions. The region A and the region B are located a distance L away from each other. The region C is located a distance L/m (m is a natural number) away from the region A between the region A and the region B. The region D is located away from the region C in a direction of the region B by a distance λ/2 from the region C. In this instance, the distance L is expressed by an equation as below with respect to the distance λ. Equation 3 is as follows:

$$L=\lambda/n$$

thus, a distance L(A-B) between detection positions in A and B is expressed as:

$$L(A\text{-}B)=L=\lambda/n,$$

a distance L(A-C) between detection positions in A and C is expressed as:

$$L(A\text{-}C)=L/m=\lambda/(mn),$$

where n is a natural number equal to or greater than 2 and m is a natural number.

In addition, first and third field detection portions 2R1 and 2R3 are located in the region A, second and fourth field detection portions 2R2 and 2R4 in the region B, a fifth field detection portion 2R5 in the region C, and a sixth field detection portion 2R6 in the region D.

Figure 5:
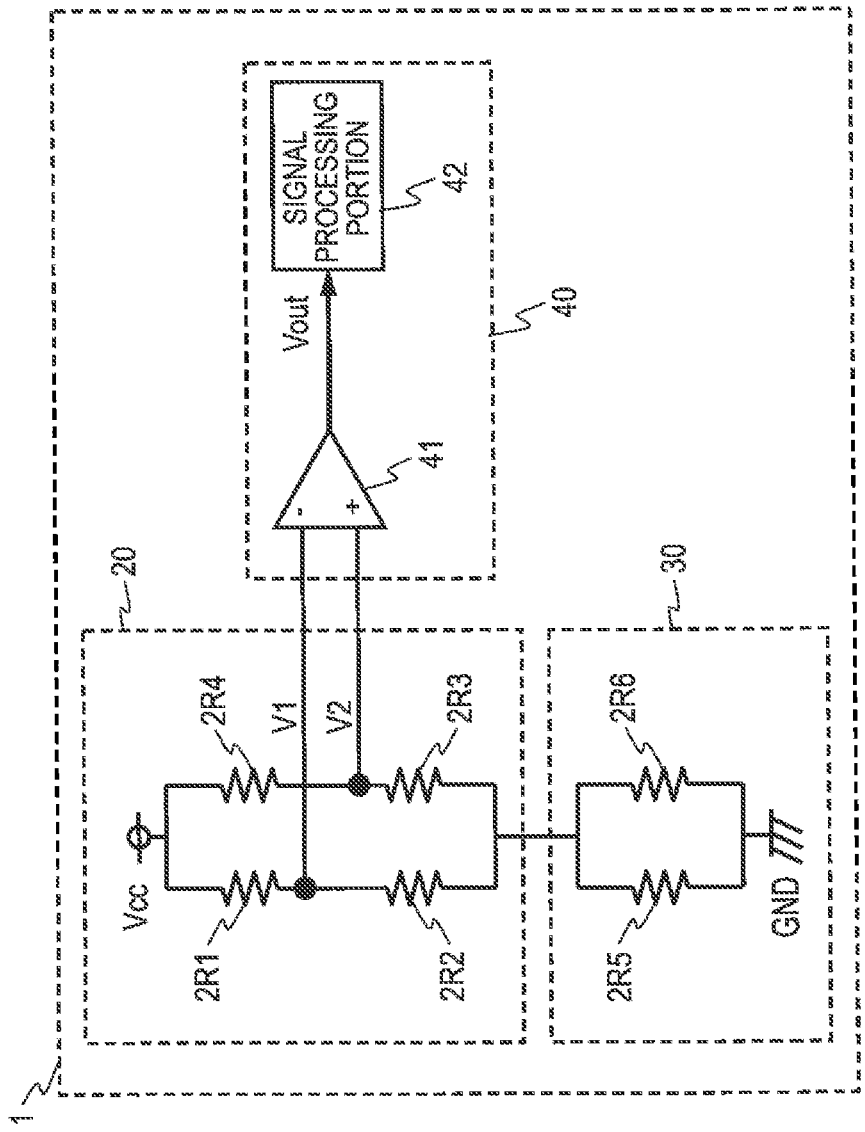
FIG. 5 is a wiring diagram showing wiring of the field detection portions in the magnetic position detection device of the first embodiment.

FIG. 5 shows wiring of the field detection portions 2 in the magnetic position detection device 100 of the first embodiment. A bridge circuit 20 and a correction circuit 30 are connected in series between a power supply Vcc and a ground GND. In the bridge circuit 20, the first and second field detection portions 2R1 and 2R2 connected in series and the third and fourth field detection portions 2R3 and 2R4 connected in series are connected in parallel. In the correction circuit 30, the fifth and sixth field detection portions 2R5 and 2R6 are connected in parallel. This device also includes a detection circuit 40 configured in such a manner that a difference of midpoint potentials of the bridge circuit 20, that is, a difference between a midpoint potential V1 of the first and second field detection portions 2R1 and 2R2 and a midpoint potential V2 of the third and fourth field detection portions 2R3 and 2R4, is introduced into a differential amplifier circuit 41 and a position of the magnetic movable body 10 is detected on the basis of an output Vout of the differential amplifier circuit 41.

Figure 6:
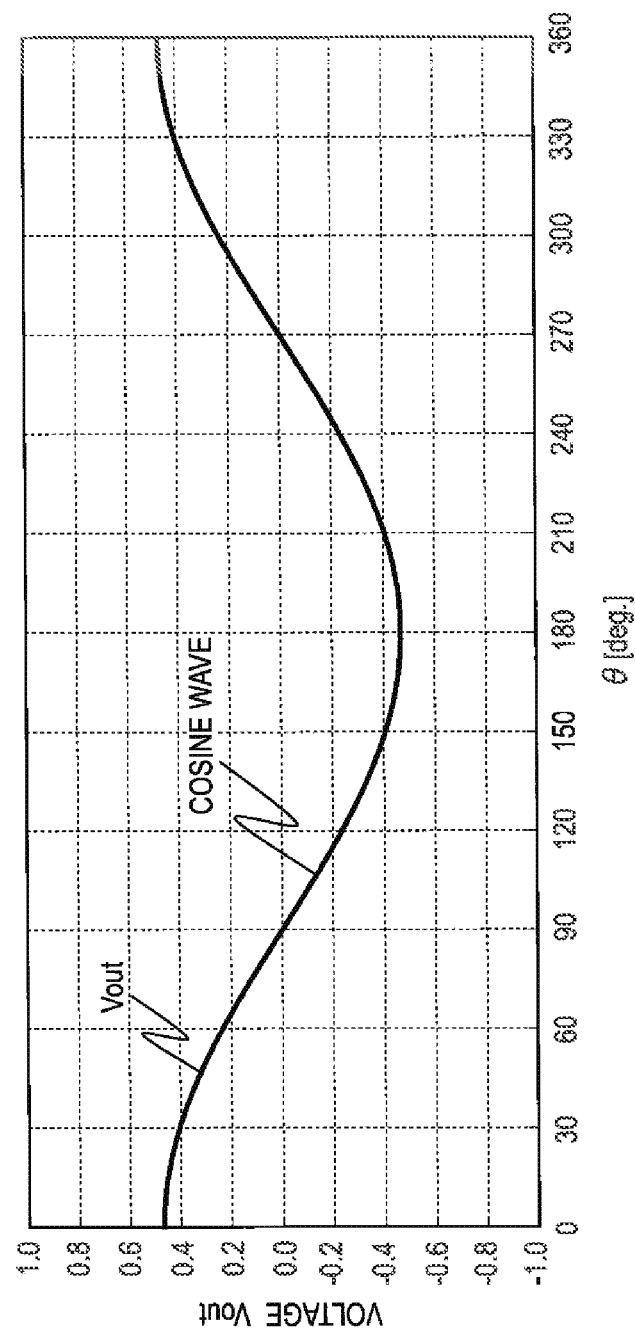
FIG. 6 is a waveform chart showing an output due to a movement of the magnetic movable body in the magnetic position detection device of the first embodiment.

A distribution of a field generated by the magnetic movable body 10 in the magnetic position detection device 100 of the first embodiment is given as Q/P≈1 (in other words, a case when Q/P≈1 will be described). In this case, a distortion of a waveform of a differential output Vout of the bridge circuit due to a distribution of the field generated by the magnetic movable body 10 is extremely small and n=2 is suitable in Equation 3 above (more specifically, when n=2, elements at two points are located in opposite phase (located 180° apart) with respect to each other and the amplitude of Vout reaches the maximum). In this case, voltage dependency of an MR ratio of the TMR elements 3T appears as a distortion of an output waveform. FIG. 6 shows a typical example of a differential output Vout of the bridge circuit in association with a movement of the magnetic movable body 10 in the first embodiment. Herein, m=2 in Equation 3 above. The drawing also shows "a cosine wave" for which a DC component, an amplitude, a frequency, and a phase are adjusted so as to minimize a difference from a differential output Vout of the bridge circuit.

Figure 7A:
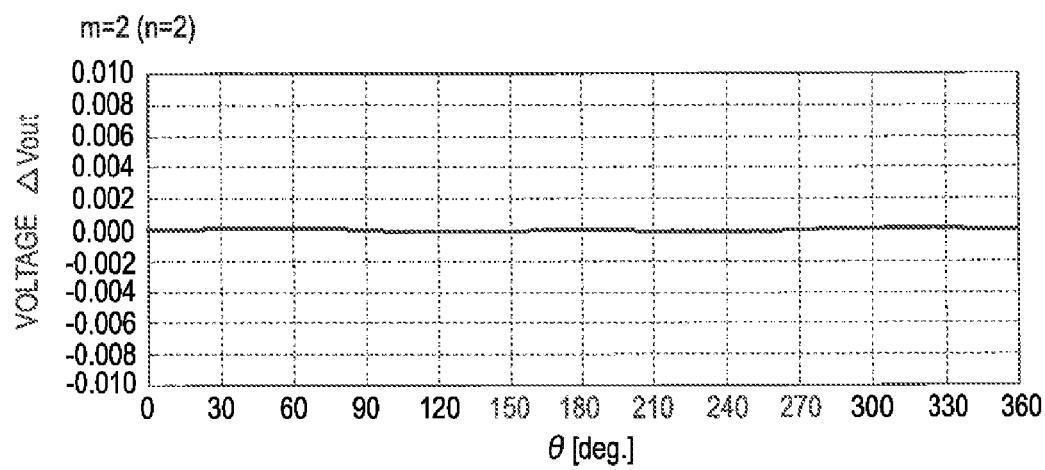
FIGS. 7A, 7B, and 7C are waveform charts showing a distortion of an output waveform due to a movement of the magnetic movable body in the magnetic position detection device of the first embodiment to show a difference signal between a differential output Vout of a bridge circuit and "a cosine wave" by setting a parameter m that defines locations of the field detection portions to different values.
Figure 7B:
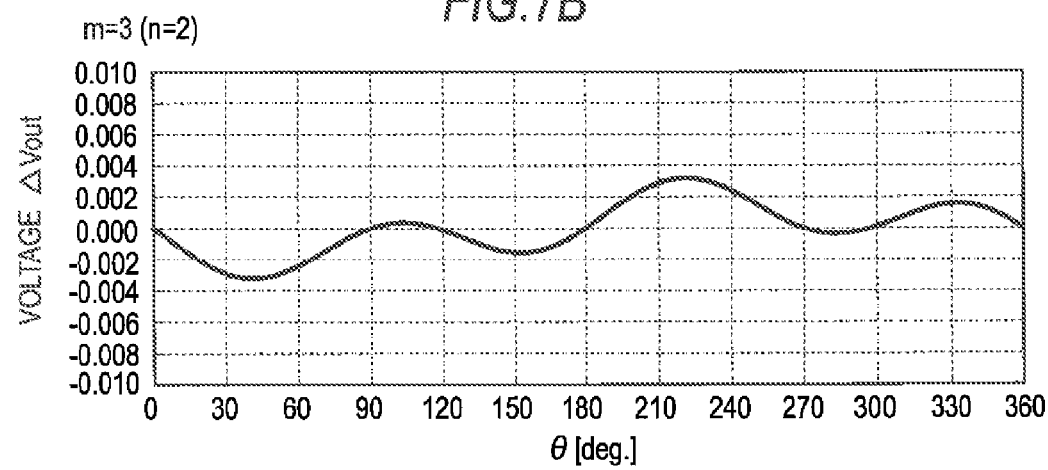
Figure 7C:
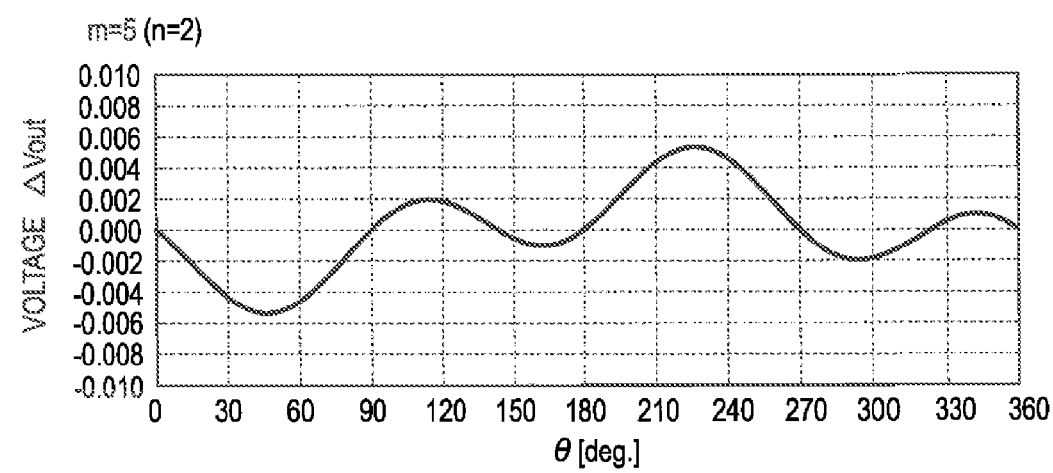

FIGS. 7A, 7B, and 7C show a difference signal ΔVout between a differential output Vout of the bridge circuit and "the cosine wave" by setting m in Equation 3 above to different values by way of example. It is understood that the difference signal ΔVout when m=2 has a minimum amplitude with a suppressed distortion and is therefore close to "the cosine wave". In other words, it is preferable that the detection positions of the field detection portions 2 forming the correction circuit 30 are such that the region C is located a distance L/2 away from the region A between the region A and the region B.

Comparative Embodiment of First Embodiment

In order to show the advantages of the first embodiment above, a comparative embodiment of the first embodiment will now be described.

The first embodiment is an embodiment that most clearly shows advantages of the correction circuit 30. Hence, a magnetic position detection device 100 of the comparative embodiment is equivalent to the device of the first embodiment from which the correction circuit 30 is removed. This comparative embodiment is an embodiment in the related art obtained by removing the region C and the region D from FIG. 4 and the fifth and sixth field detection portions 2R5 and 2R6 from FIG. 5. A comparison was made by setting m and n in the first embodiment as: m=2 and n=2, and n in the comparative embodiment as: n=2.

Figure 8A:
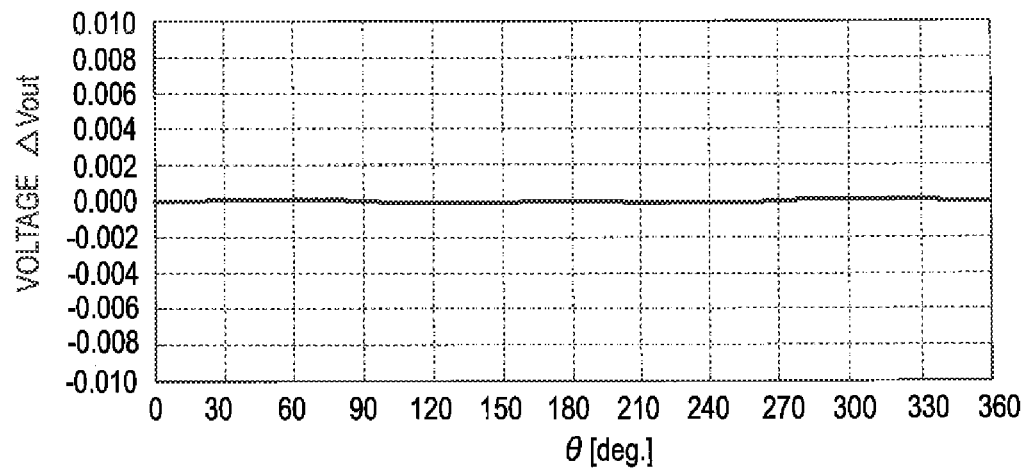
FIGS. 8A and 8B are waveform charts showing a distortion of an output waveform due to a movement of the magnetic movable body in the magnetic position detection devices in the first embodiment and a comparative embodiment thereof, respectively.
Figure 8B:
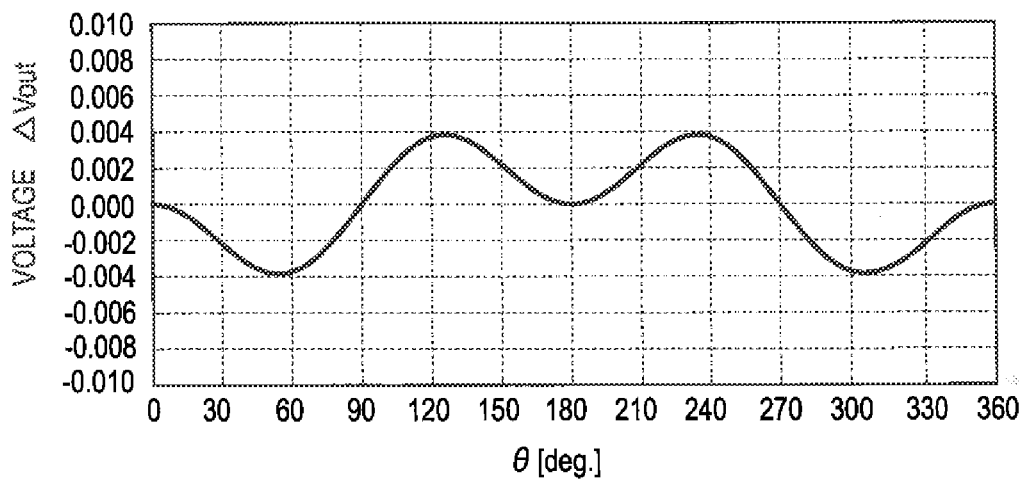

FIGS. 8A and 8B show a difference signal ΔVout between a differential output Vout of the bridge circuit and "the cosine wave" in the first embodiment and the comparative embodiment, respectively. It is understood that an amplitude of the difference signal ΔVout is smaller in the first embodiment than in the comparative embodiment and is therefore a distortion from "the cosine wave" is removed by the correction circuit 30.

This result is obtained because, although a combined resistance of the bridge circuit 20 is not constant due to voltage dependency of an MR ratio of the TMR elements 3T and has a phase, the phase of a combined resistance of the correction circuit 30 is in opposite phase and cancels out the phase of the combined resistance of the bridge circuit 20.

Figure 9:
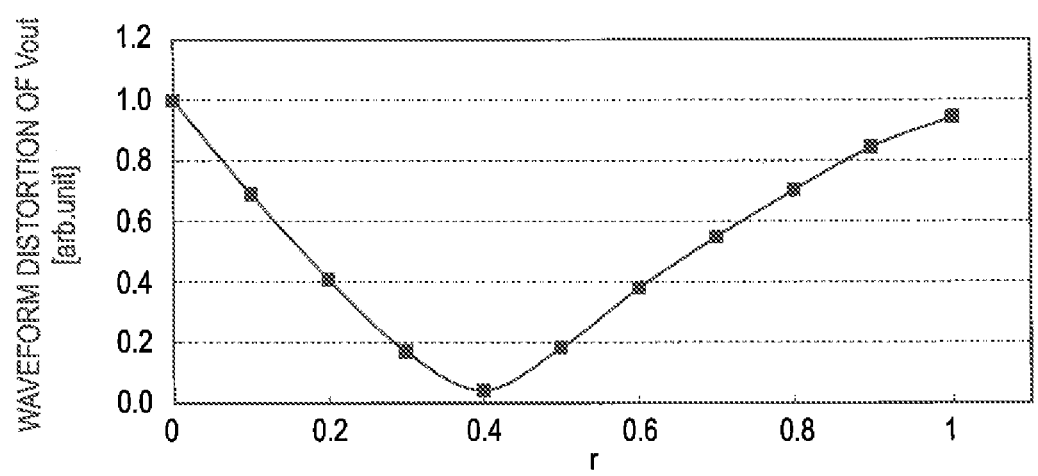
FIG. 9 is a characteristic view showing a relation of a ratio r of an electrical resistance value of a correction circuit with respect to an electrical resistance value of the bridge circuit and a distortion of an output waveform in the magnetic position detection device of the first embodiment.

Further, in order to reduce a distortion of an output waveform, it is necessary that an amplitude of a waveform of the combined resistance of the bridge circuit 20 is nearly equal to an amplitude of a waveform of the combined resistance of the correction circuit 30. Accordingly, the four field detection portions 2R1, 2R2, 2R3, and 2R4 forming the bridge circuit 20 are formed in such a manner that the electrical resistance values of the first and second field detection portions 2R1 and 2R2 are equal to each other and the electrical resistance values of the third and fourth field detection portions 2R3 and 2R4 are equal to each other when an angle yielded between the magnetization direction of the magnetization fixed layer 3b and the magnetization direction of the magnetization free layer 3a is equal in the respective TMR elements 3T forming the field detection portions 2. It is further preferable to form the four field detection portions 2R1, 2R2, 2R3, and 2R4 so that the electrical resistance values are all equal. It is also preferable to form the two field detection portions 2R5 and 2R6 forming the correction circuit 30 in such a manner that the electrical resistance value of each becomes equal when an angle yielded between the magnetization direction of the magnetization fixed layer 3b and the magnetization direction of the magnetization free layer 3a is equal in the respective TMR elements 3T forming the field detection portions 2. Tunneling magneto-resistance elements in which the intermediate layers are an insulator are used as the magneto-resistance elements forming the first through fourth field detection portions. It is preferable to use tunneling magneto-resistance elements in which the intermediate layers are an insulator also as the magneto-resistance elements forming the fifth and sixth field detection portions. Further, it is preferable to use giant magneto-resistance elements in which the intermediate layers are a non-magnetic metal body as the magneto-resistance elements forming the fifth and sixth field detection portions. FIG. 9 shows a relation between a ratio r of an electrical resistance value of one field detection portion 2 forming the correction circuit 30 with respect to an electrical resistance value of one field detection portion 2 forming the bridge circuit 20 (herein, a ratio of the electrical resistance values of the first field detection portion 2R1 and the fifth field detection portion 2R5)=R5/R1 and a distortion of the waveform of a differential output Vout of the bridge circuit (amplitude of a difference signal between a differential output Vout and "the cosine wave"). Herein, r=0 is a case where the correction circuit 30 is absent, that is, the embodiment in the related art (comparative embodiment). By defining that a distortion of the waveform of a differential output Vout of the bridge circuit of this embodiment is 1, the drawing shows a normalized distortion of the output waveform of the first embodiment. Advantages of the correction circuit 30 are confirmed when r is in a range, 0<r≤1, that is, 0<(R5/R1)≤1. In the first embodiment, the advantages are most significant when r=0.3 to 0.5.

Property Comparison when Distribution of Field Generated by Magnetic Movable Body 10 is Q/P≤1

FIG. 9 shows the advantages of the magnetic position detection device 100 of the invention in comparison with the magnetic position detection device in the related art. It is understood that the first embodiment is advantageous in reducing a distortion of the output waveform. Hence, according to the invention, it becomes possible to provide the magnetic position detection device 100 capable of effectively reducing a distortion of an output waveform due to voltage dependency of an MR ratio of the TMR elements 3T and therefore obtaining precise position information at a high degree of accuracy.

Second Embodiment

In a magnetic position detection device 100 of a second embodiment, the number of the detection positions and the locations of the field detection portions 2 at the respective detection positions are the same as those in the first embodiment above. Four regions, namely a region A, a region B, a region C and a region D, are provided at the detection positions. The region A and the region B are located a distance L away from each other. The region C is located a distance L/m (m is a natural number) away from the region A between the region A and the region B. The region D is located away from the region C in a direction of the region B by a distance λ/2 from the region C. In this instance, as is expressed in Equation 3 above, the distance L is expressed with respect to the distance λ as: L=λ/n (n is a natural number equal to or greater than 2). Also, the first and third field detection portions 2R1 and 2R3 are located in the region A, the second and fourth field detection portions 2R2 and 2R4 in the region B, the fifth field detection portion 2R5 in the region C, and the sixth field detection portion 2R6 in the region D.

Wiring of the field detection portions 2 in the magnetic position detection device 100 of the second embodiment is the same as that in the first embodiment above. A bridge circuit 20 and a correction circuit 30 are connected in series between a power supply Vcc and a ground GND. In the bridge circuit 20, the first and second field detection portions 2R1 and 2R2 connected in series and the third and fourth field detection portions 2R3 and 2R4 connected in series are connected in parallel. In the correction circuit 30, the fifth and sixth field detection portions 2R5 and 2R6 are connected in parallel. This device also includes a detection circuit 40 that detects a position of the magnetic movable body 10 on the basis of a difference of midpoint potentials of the bridge circuit 20, that is, a difference Vout between a midpoint potential V1 of the first and second field detection portions 2R1 and 2R2 and a midpoint potential V2 of the third and fourth field detection portions 2R3 and 2R4.

Figure 10A:
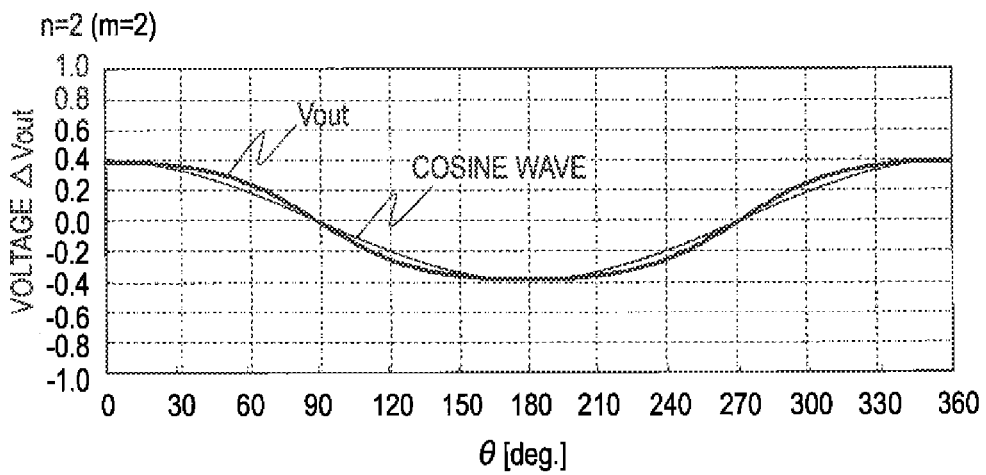
FIGS. 10A, 10B, and 10C are waveform charts showing an output due to a movement of a magnetic movable body in a magnetic position detection device of a second embodiment to show a differential output Vout of a bridge circuit by setting a parameter n that defines locations of the field detection portions to different values.
Figure 10B:
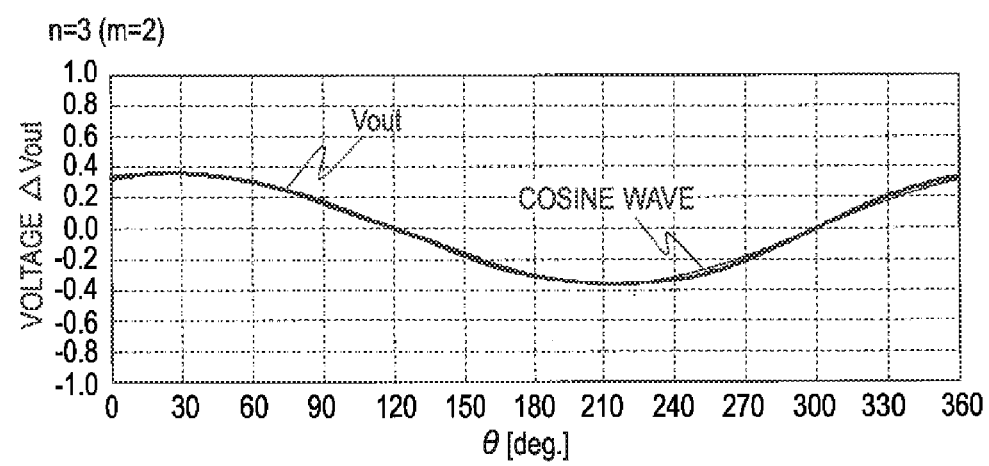
Figure 10C:
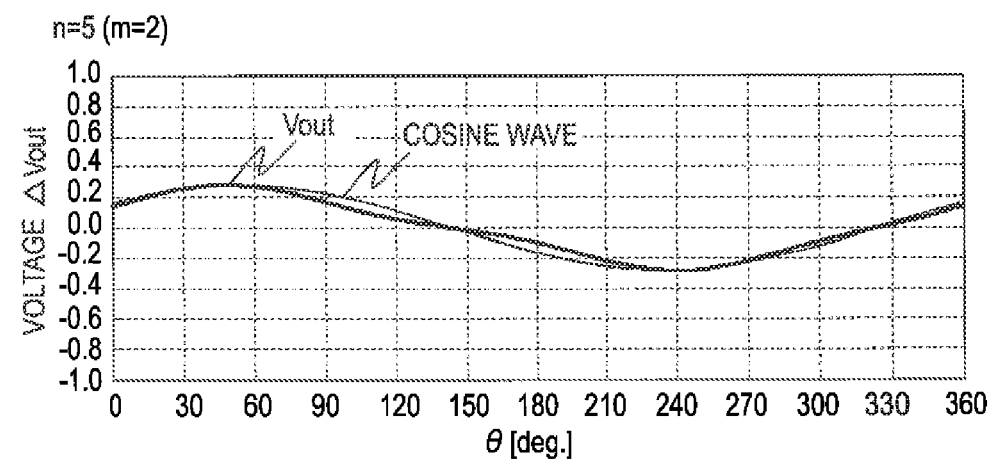

A distribution of the field generated by the magnetic movable body 10 in the magnetic position detection device 100 of the second embodiment is given as: Q/P=0.7 (in other words, a case when Q/P=0.7 will be described). In this case, a distribution of a field generated by the magnetic movable body 10 and voltage dependency of an MR ratio of the TMR elements 3T appear as a distortion of the waveform of a differential output Vout of the bridge circuit. In the second embodiment, the detection positions are changed from those in the first embodiment above to address a distortion of the output waveform due to a distribution of the field generated by the magnetic movable body 10. FIGS. 10A, 10B, and 10C show a differential output Vout of the bridge circuit in association with a movement of the magnetic movable body 10 of the second embodiment by setting n in Equation 3 above to different values by way of example. Herein, m=2. The drawings also show "a cosine wave" for which a DC component, an amplitude, a frequency, and a phase are adjusted so as to minimize a difference from a differential output Vout of the bridge circuit.

Figure 11A:
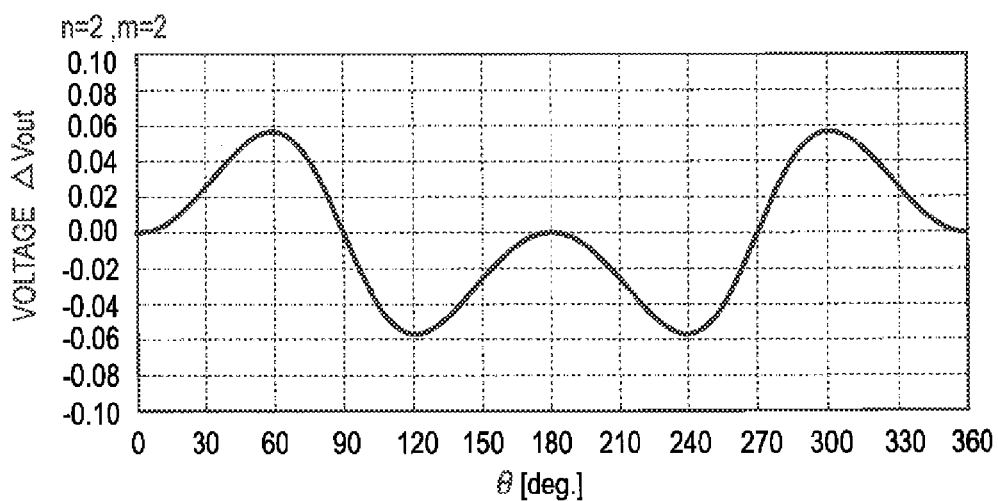
FIGS. 11A, 11B, and 11C are waveform charts showing a distortion of an output waveform due to a movement of the magnet movable body in the magnetic position detection device of the second embodiment to show a difference signal between a differential output Vout of the bridge circuit and "a cosine wave" by setting parameters m and n that define locations of the field detection portions to different values.
Figure 11B:
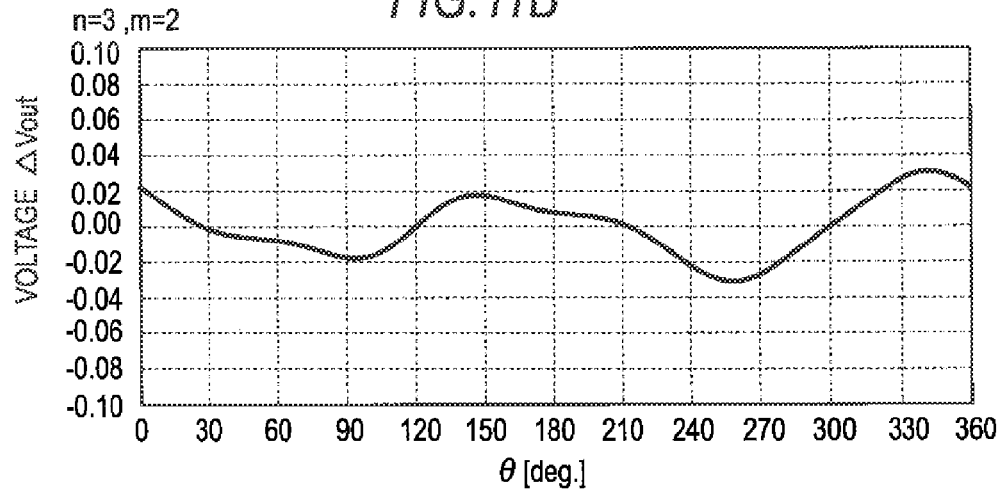
Figure 11C:
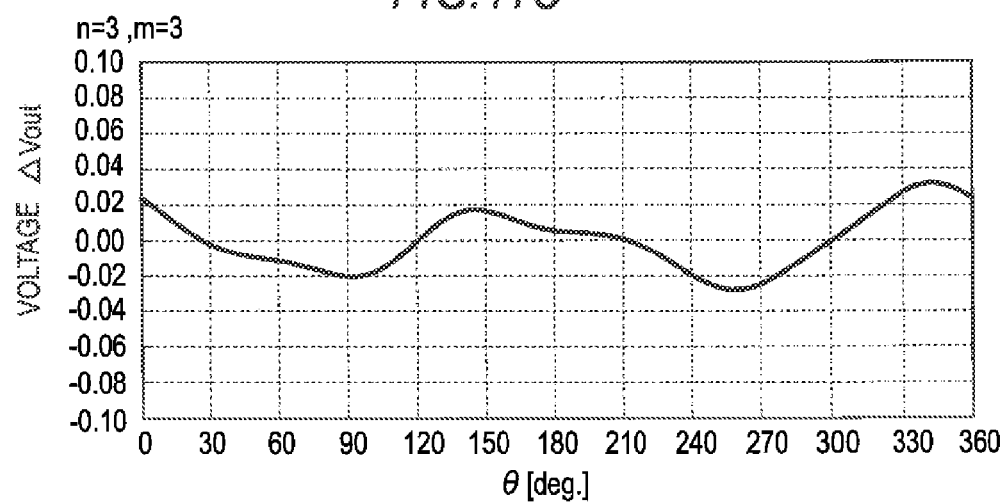

FIGS. 11A, 11B, and 11C show a difference signal ΔVout between a differential output Vout of the bridge circuit and "the cosine wave" by setting m and n in Equation 3 above to different values by way of example. It is understood that a differential signal ΔVout when m=n=3 has a minimum amplitude with a suppressed distortion and is therefore close to "the cosine wave". When Q/P=0.7, as are shown in FIGS. 10A, 10B, and 10C, a third harmonic component is added to a differential output Vout of the bridge circuit and the waveform is distorted when n=2. By setting as: n=3, that is, by locating the region A and the region B a distance L=λ/3 away from each other, the third harmonic component is suppressed and the distortion is reduced.

Embodiment without Correction Circuit of Second Embodiment

An embodiment without the correction circuit of the second embodiment is equivalent to the second embodiment from which the correction circuit 30 is removed. This embodiment is an embodiment obtained by removing the region C and the region D from FIG. 4 and the fifth and sixth field detection portions 2R5 and 2R6 from FIG. 5. Herein, m and n in the second embodiment are set as: m=3 and n=3 and n in the embodiment without the correction circuit is set as: n=3. A difference from the embodiment in the related art is that the detection positions are defined by n=3 instead of n=2 and a third harmonic component in a differential output Vout of the bridge circuit is suppressed.

Figure 12A:
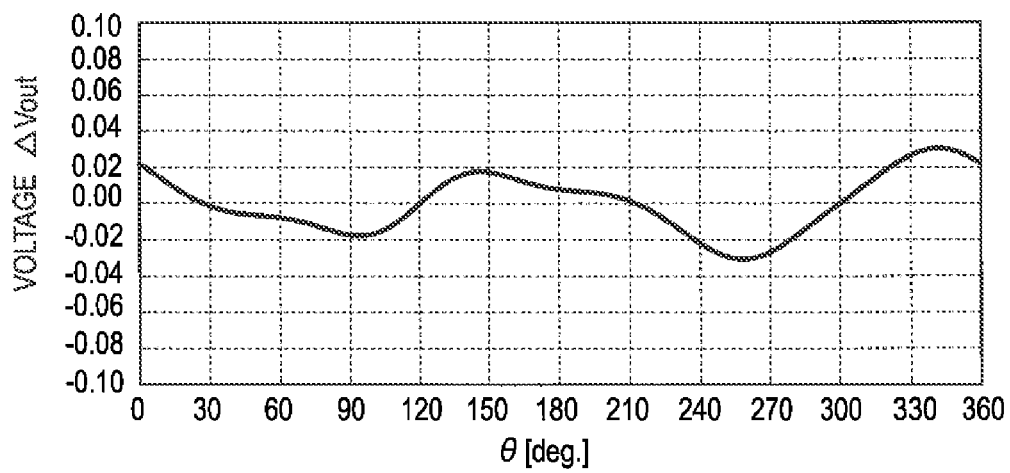
FIGS. 12A and 12B are waveform charts showing a distortion of an output waveform due to a movement of the magnetic movable body in the magnetic position detection devices of the second embodiment and an embodiment without a correction circuit, respectively, to show a difference signal between a differential output Vout of the bridge circuit and "a cosine wave".
Figure 12B:
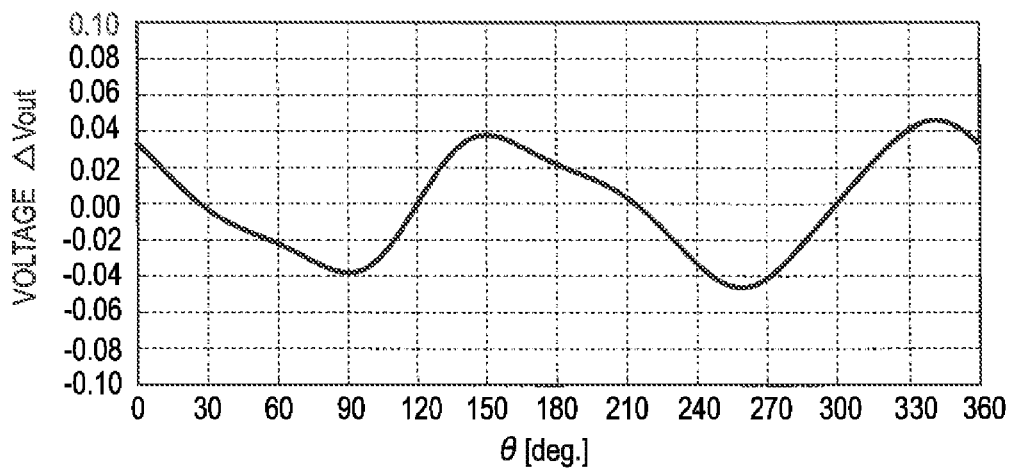

FIGS. 12A and 12B show a difference signal ΔVout between a differential output Vout of the bridge circuit and "the cosine wave" in the second embodiment and the embodiment without the correction circuit, respectively. It is understood from the comparison of the two embodiments that a distortion from "the cosine wave" is eliminated by the correction circuit 30. In the second embodiment, too, the advantages of the correction circuit 30 are confirmed. On the other hand, there is still a distortion of an output waveform due to a distribution of the field generated by the magnetic movable body 10.

Third Embodiment

FIG. 13 shows positions (detection positions) at which to locate the field detection portions 2 in a magnetic position detection device 100 of a third embodiment. Eight regions, namely, a region A, a region B, a region C, a region D, a region E, a region F, a region G, and a region H, are provided as the detection positions. The region A and the region B are located a distance L1 away from each other. The region C is located a distance L1/m1 (m1 is a natural number) away from the region A between the region A and the region B. The region D is located away from the region C in a direction of the region B by a distance λ/2 from the region C. In addition, the region E is located away from the region A in a direction of the region B and the region A and the region E are located a distance L2 away from each other. The region F is located away from the region E in a direction of the region D and the region E and the region F are located the distance L1 away from each other. The region G is located a distance L1/m2 (m2 is a natural number) away from the region E between the region E and the region F. The region H is located away from the region G in a direction of the region F and located the distance λ/2 away from the region G. In this instance, the distances L1 and L2 are expressed by an equation as below with respect to the distance λ. Equation 4 is as follows:

$$L=\lambda/n,$$

thus, a distance L(A-B) between detection positions in A and B is expressed as:

$$L(A\text{-}B)=L1=\lambda/n1,$$

a distance L(A-C) between detection positions in A and C is expressed as:

$$L(A\text{-}C)=L1/m1=\lambda/(m1n1),$$

a distance L(A-E) between detection positions in A and E is expressed as:

$$L(A\text{-}E)=L2=\lambda/n2,$$

a distance L(E-F) between detection positions in E and F is expressed as:

$$L(E\text{-}F)=L1=\lambda/n1, \text{ and}$$

a distance L(E-G) between detection positions in E and G is expressed as:

$$L(E\text{-}G)=L1/m2=\lambda/(m2n1),$$

where n1 and n2 are natural numbers equal to or greater than 2 and m1 and m2 are natural numbers.

Also, the first and third field detection portions 2R1 and 2R3 are located in the region A, the second and fourth field detection portions 2R2 and 2R4 in the region B, the fifth field detection portion 2R5 in the region C, and the sixth field detection portion 2R6 in the region D. In addition, seventh and ninth field detection portions 2R7 and 2R9 are located in the region E, eighth and tenth field detection portions 2R8 and 2R10 in the region F, an eleventh field detection portion 2R11 in the region G, and a twelfth field detection portion 2R12 in the region H. The configurations of the magneto-resistance elements forming the first through sixth field detection portions are the same as the configurations described in the first embodiment above and correspond to configurations of magneto-resistance elements forming the seventh through twelfth field detection portions, respectively. Magnetization directions of the magnetization fixed layers in the respective magneto-resistance elements forming the first through twelfth field detection portions are all in a same direction with respect to a movement direction of the magnetic movable body.

Figure 14:
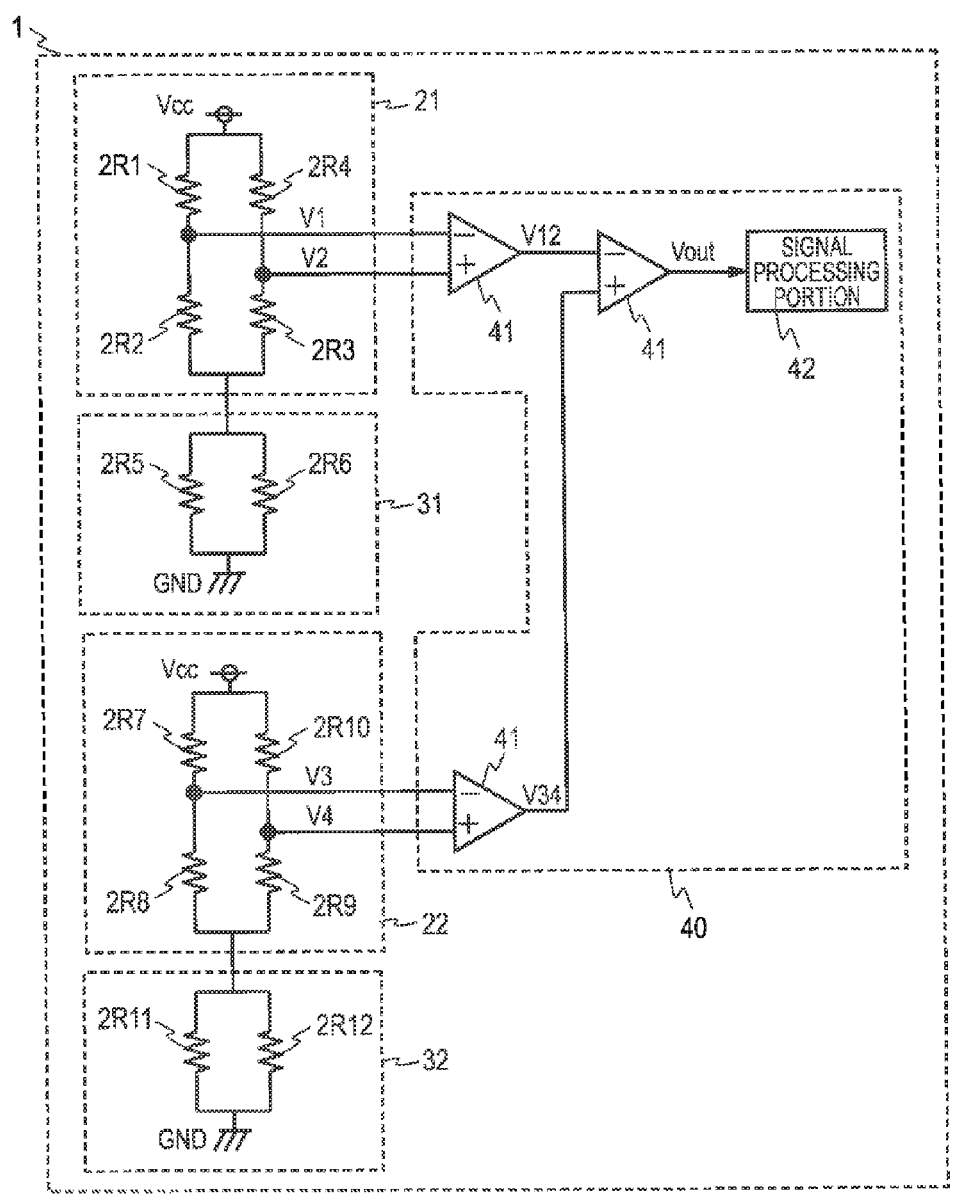
FIG. 14 is a wiring diagram showing wiring of the field detection portions in the magnetic position detection device of the third embodiment.

FIG. 14 shows wiring of the field detection portions 2 in the magnetic position detection device 100 of the third embodiment. Herein, there are two systems, in each of which a bridge circuit and a correction circuit are connected in series between a power supply Vcc and a ground GND. A first system is formed of a first bridge circuit 21 and a first correction circuit 31. In the first bridge circuit 21, the first and second field detection portions 2R1 and 2R2 connected in series and the third and fourth field detection portions 2R3 and 2R4 connected in series are connected in parallel. In the first correction circuit 31, the fifth and sixth field detection portions 2R5 and 2R6 are connected in parallel. A second system is formed of a second bridge circuit 22 and a second correction circuit 32. In the second bridge circuit 22, the seventh and ninth field detection portions 2R7 and 2R9 connected in series and the eighth and tenth field detection portions 2R8 and 2R10 connected in series are connected in parallel. In the second correction circuit 32, the eleventh and twelfth field detection portions 2R11 and 2R12 are connected in parallel. Also, this device includes a detection circuit 40 that detects a position of the magnetic movable body 10 on the basis of a difference between midpoint potentials of the bridge circuits 21 and 22, more specifically, a difference Vout between a difference V12, which is a difference between a midpoint potential V1 of the first and second field detection portions 2R1 and 2R2 and a midpoint potential V2 of the third and fourth field detection portions 2R3 and 2R4, and a difference V34, which is a difference between a midpoint potential V3 of the seventh and eighth field detection portions 2R7 and 2R8 and a midpoint potential V4 of the ninth and tenth field detection portions 2R9 and 2R10.

Figure 15A:
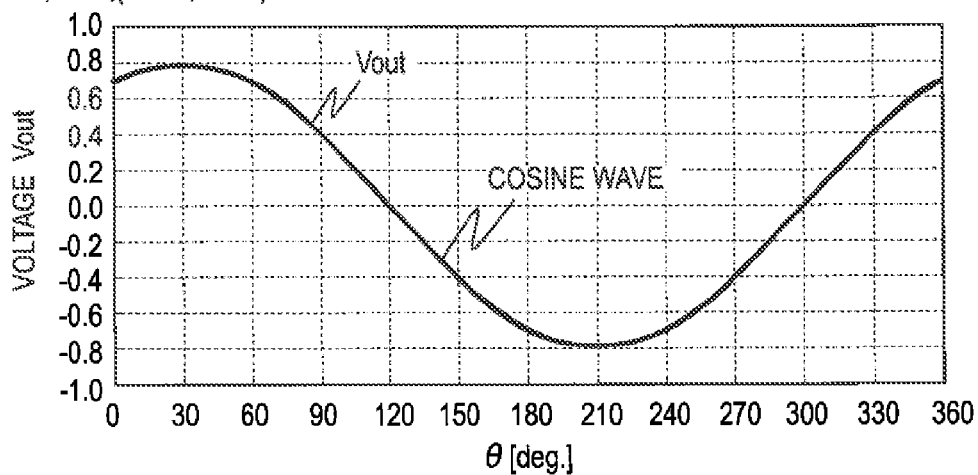
FIGS. 15A, 15B, and 15C are waveform charts showing an output due to a movement of a magnetic movable body in the magnetic position detection device of the third embodiment to show a differential output Vout of a bridge circuit by setting parameters n1 and n2 that define locations of the field detection portions to different values.
Figure 15B:
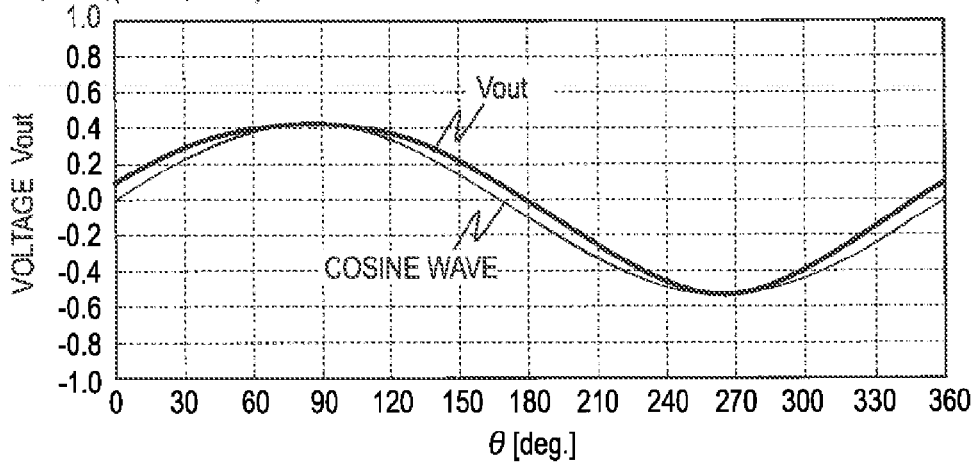
Figure 15C:
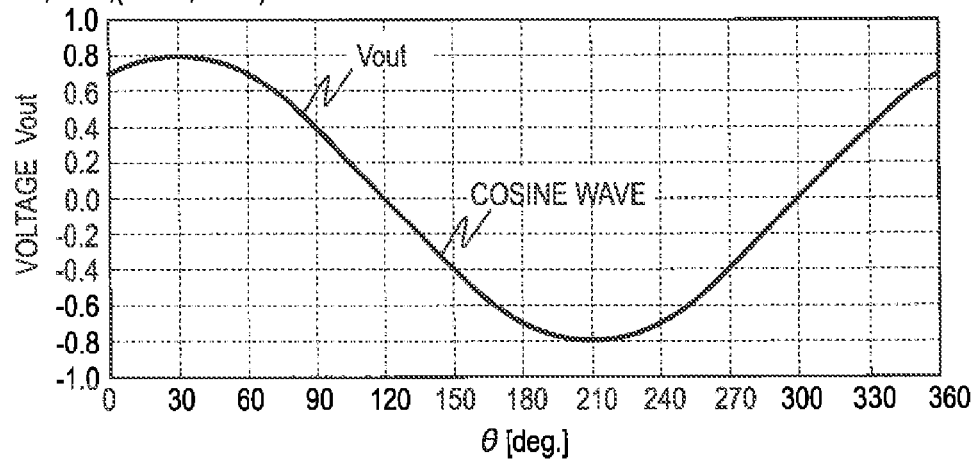

A distribution of the field generated by the magnetic movable body 10 in the magnetic position detection device 100 of the third embodiment is given as: Q/P=0.7 (in other words, a case when Q/P=0.7 will be described). In this case, a distribution of the field generated by the magnetic movable body 10 and voltage dependency of an MR ratio of the TMR elements 3T appear as a distortion of the waveform of a differential output Vout of the bridge circuit. The third embodiment addresses a distortion of an output waveform due to a distribution of the field generated by the magnetic movable body 10 and therefore has the bridge circuits 21 and 22 in two systems so that harmonic components of two orders, n1 and n2, are suppressed in comparison with the second embodiment above. FIGS. 15A, 15B, and 15C show a differential output Vout of the bridge circuit in association with a movement of the magnetic movable body 10 in the third embodiment by setting n1 and n2 in Equation 4 above to different values by way of example. Herein, n1=m1 and n2=m2. The drawings also show "a cosine wave" for which a DC component, an amplitude, a frequency, and a phase are adjusted so as to minimize a difference from a differential output Vout of the bridge circuit.

Figure 16A:
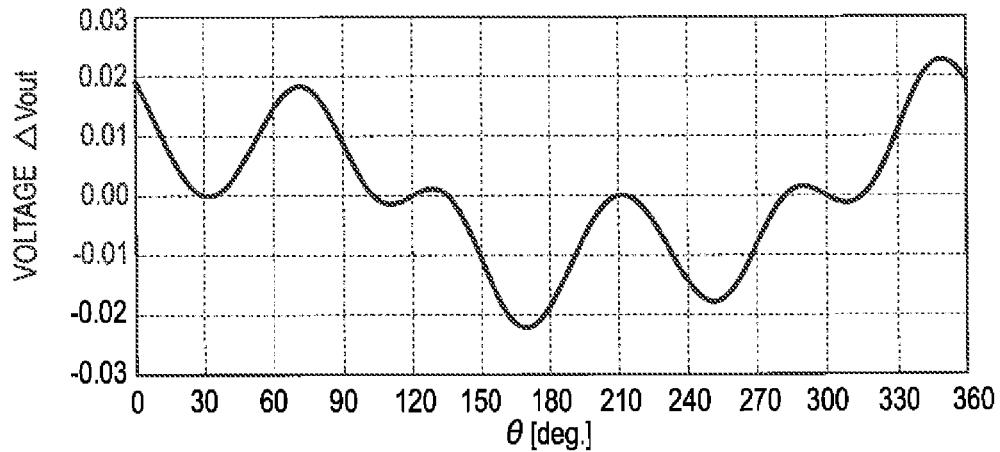
FIGS. 16A, 16B, and 16C are waveform charts showing a distortion of an output waveform due to a movement of the magnetic movable body in the magnetic position detection device of the third embodiment to show a difference signal between a differential output Vout of a bridge circuit and "a cosine wave" by setting parameters n1, n2, m1, and m2 that define locations of the field detection portions to different values.
Figure 16B:
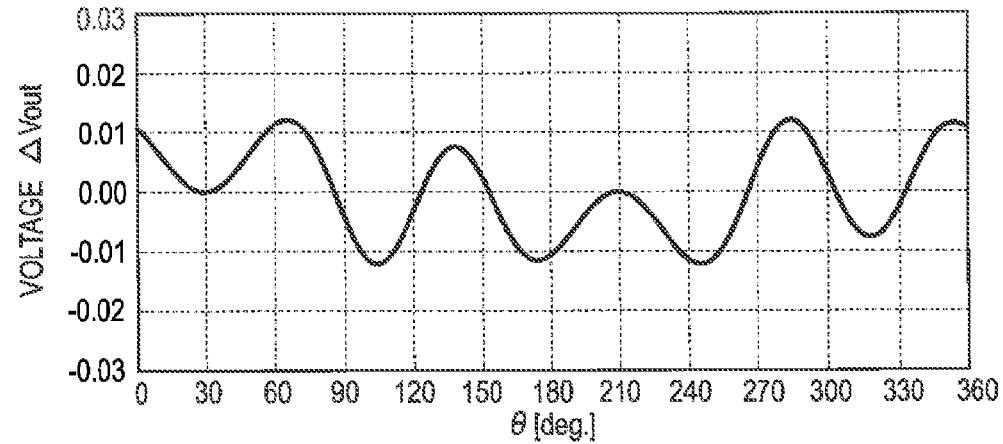
Figure 16C:
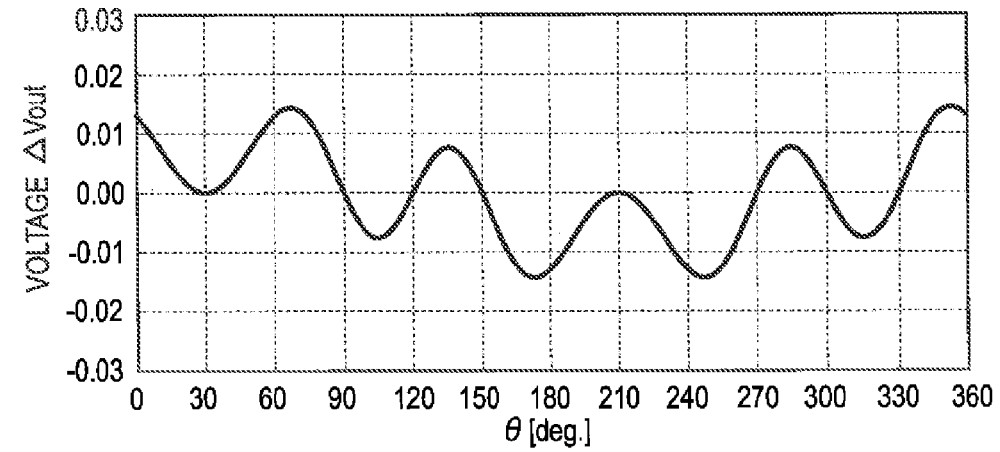

FIGS. 16A, 16B, and 16C show a difference signal ΔVout between a differential output Vout of the bridge circuit and "the cosine wave" by setting n1, n2, m1, and m2 in Equation 4 above to different values by way of example. In the third embodiment, harmonic components of two orders when n1=2 and n2=3, that is, second and third harmonic components, are suppressed and so is a distortion. In FIG. 16A, n1>n2 and m2=n2. It is understood that a difference signal ΔVout when m2=3 has a minimum amplitude with a suppressed distortion and is therefore close to "the cosine wave". The detection positions of the field detection portions 2 forming the second correction circuit 32 relate to a distance n2 between the bridge circuits 21 and 22 in two systems and it is preferable to set as: n2=m2, that is, to locate the region G a distance L/3 away from the region E between the region E and the region F.

Embodiment without Correction Circuits of Third Embodiment

An embodiment without the correction circuits of the third embodiment is equivalent to the third embodiment from which the correction circuits 31 and 32 are removed. This embodiment is an embodiment obtained by removing the region C, the region D, the region G, and the region H from FIG. 13 and by removing the fifth and sixth field detection portions 2R5 and 2R6 and the eleventh and twelfth field detection portions 2R11 and 2R12 from FIG. 14. Herein, m and n in the third embodiment are set as: m1=2, m2=3, n1=2, and n2=3, and n in the embodiment without the correction circuits is set as: n1=2 and n2=3. A difference from the embodiment without the correction circuit of the second embodiment above is that the bridge circuit 22 is added and the detection positions are defined in two different manners by n=2 in addition to n=3 so that second and third harmonic components in a differential output Vout of the bridge circuit are suppressed.

Figure 17A:
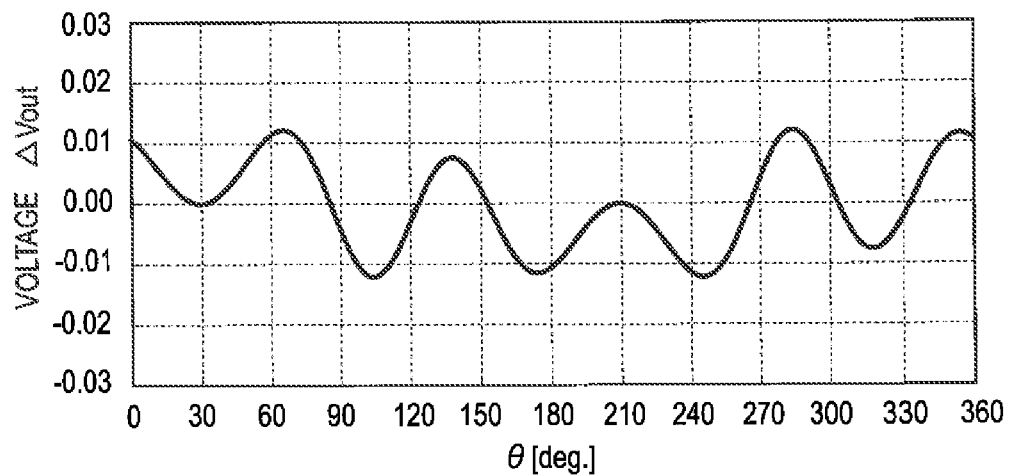
FIGS. 17A and 17B are waveform charts showing a distortion of an output waveform due to a movement of the magnetic movable body in the magnetic position detection devices of the third embodiment and an embodiment without correction circuits, respectively.
Figure 17B:
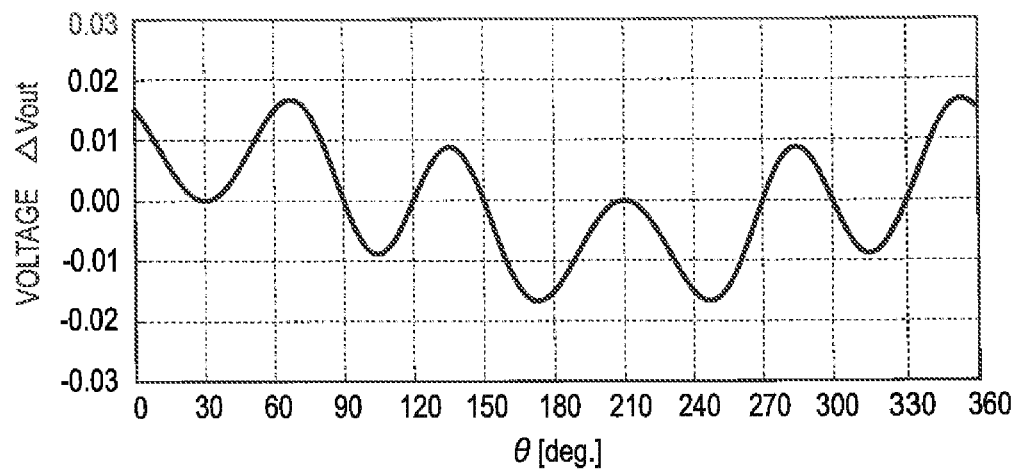

FIGS. 17A and 17B show a difference signal ΔVout between a differential output Vout of the bridge circuit and "the cosine wave" in the third embodiment and the embodiment without the correction circuits of the third embodiment, respectively. It is understood from a comparison between the two embodiments that a distortion from "the cosine wave" is removed by the correction circuits 31 and 32.

Figure 18:
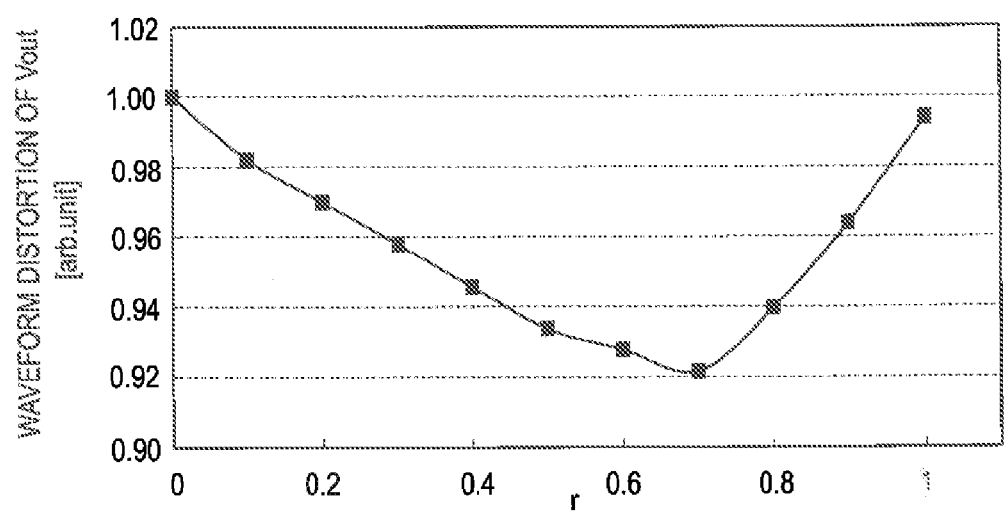
FIG. 18 is a characteristic view showing a relation of a ratio r of an electrical resistance value of the correction circuits with respect to an electrical resistance value of the bridge circuits and a distortion of an output waveform in the magnetic position detection device of the third embodiment.

FIG. 18 shows a relation between a ratio r of an electrical resistance value of one field detection portion 2 forming each of the correction circuits 31 and 32 with respect to the electrical resistance value of one field detection portion 2 forming each of the bridge circuits 21 and 22 (herein, a ratio of the electrical resistance values of the first field detection portion 2R1 and the fifth field detection portion 2R5 and a ratio of the electrical resistance values of the seventh field detection portion 2R7 and the eleventh field detection portion 2R11)=R5/R1 and R11/R7 and a distortion of the waveform of a differential output Vout of the bridge circuits (amplitude of a difference signal between a differential output Vout and "the cosine wave"). Herein, r=0 is a case where the correction circuits 31 and 32 are absent. By defining that a distortion of the waveform of a differential output Vout of the bridge circuit of this embodiment is 1, the drawing shows a normalized distortion of the output waveform of the third embodiment. Advantages of the correction circuits 31 and 32 are confirmed when r is in a range, 0<r≤1, that is, 0<(R5/R1)≤1 and 0<(R11/R7)≤1. In the third embodiment, the advantages are most significant when r=0.5 to 0.8.

Property Comparison when Distribution of Field Generated by Magnetic Movable Body 10 is Q/P<1

Figure 19:
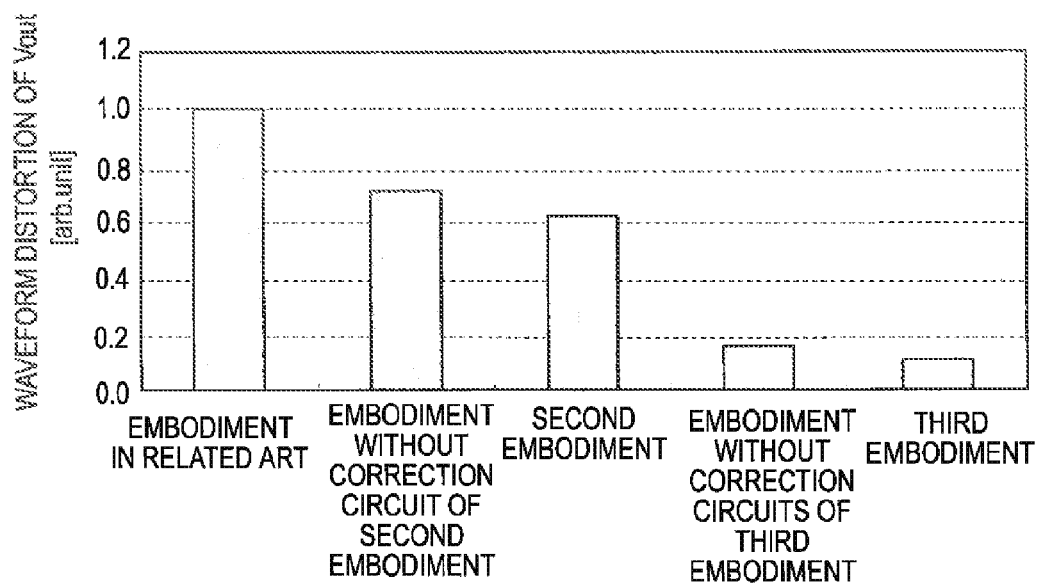
FIG. 19 is a characteristic comparison view among the magnetic position detection devices of the embodiment in the related art, the second embodiment, the third embodiment, and embodiments without the correction circuits of the second and third embodiments.
Figure 20:
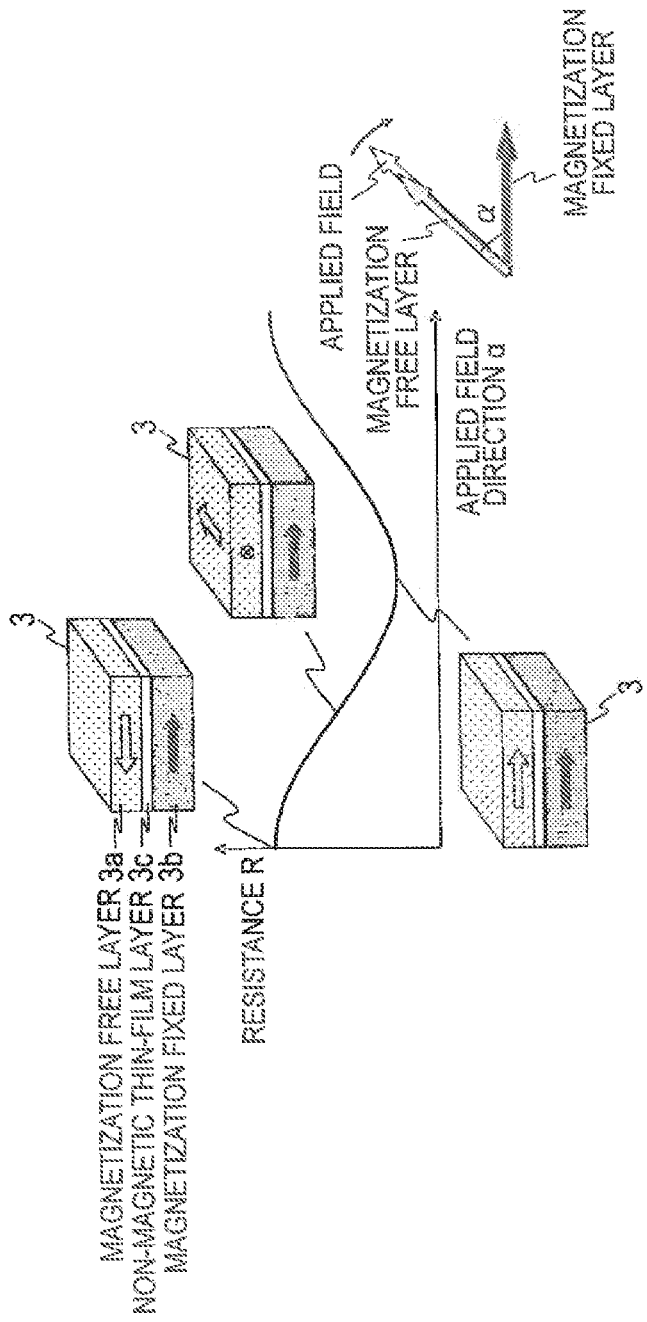
FIG. 20 is a view showing a variance of an electrical resistance value of spin-valve MR elements.
Figure 21A:
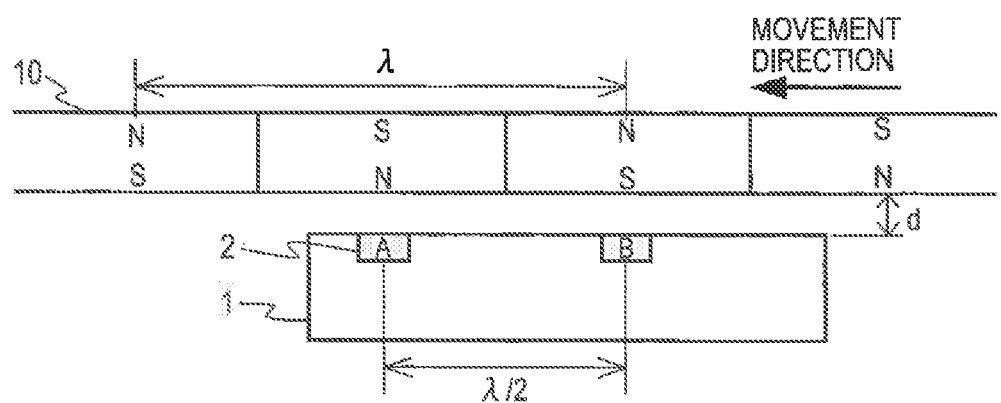
FIGS. 21A and 21B are configuration views showing an example of the magnetic position detection device in the related art.
Figure 21B:
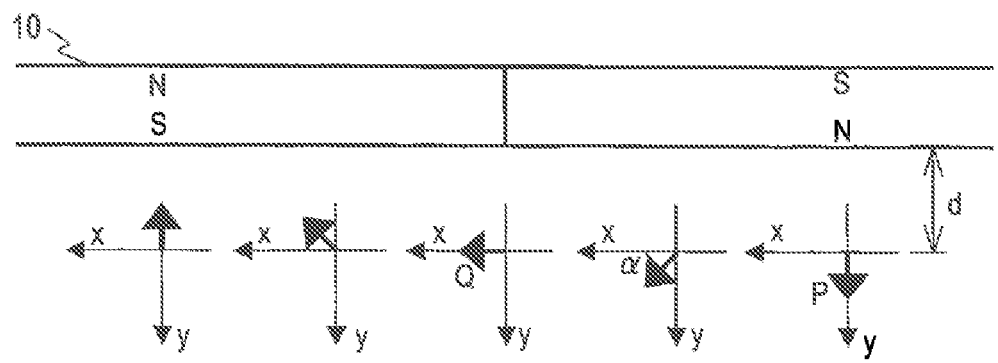
Figure 22:
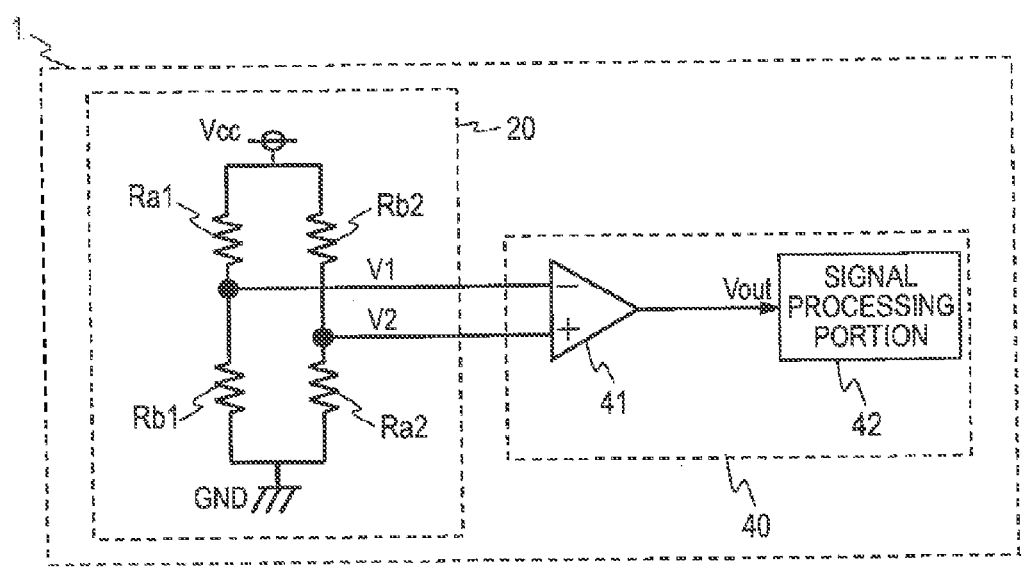
FIG. 22 is a wiring diagram showing wiring of field detection portions forming a bridge circuit in the magnetic position detection device in the related art.
Figure 23:
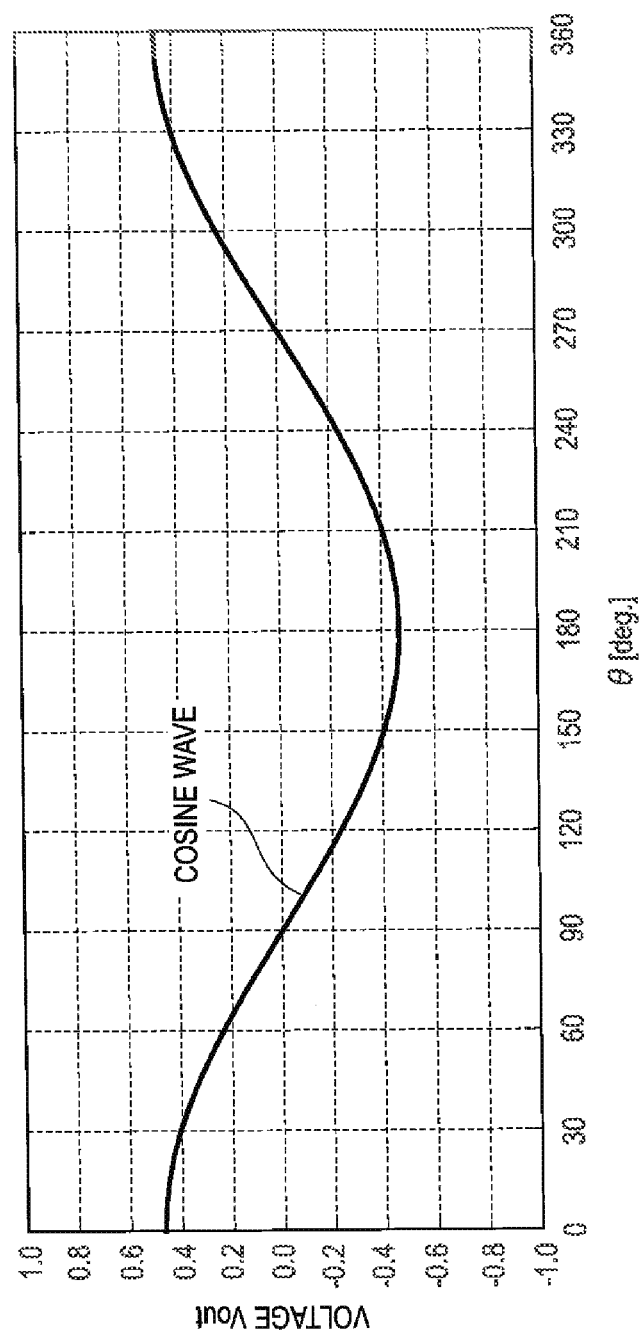
FIG. 23 is an output waveform chart due to a movement of a magnetic movable body in the magnetic position detection device in the related art.
Figure 24:
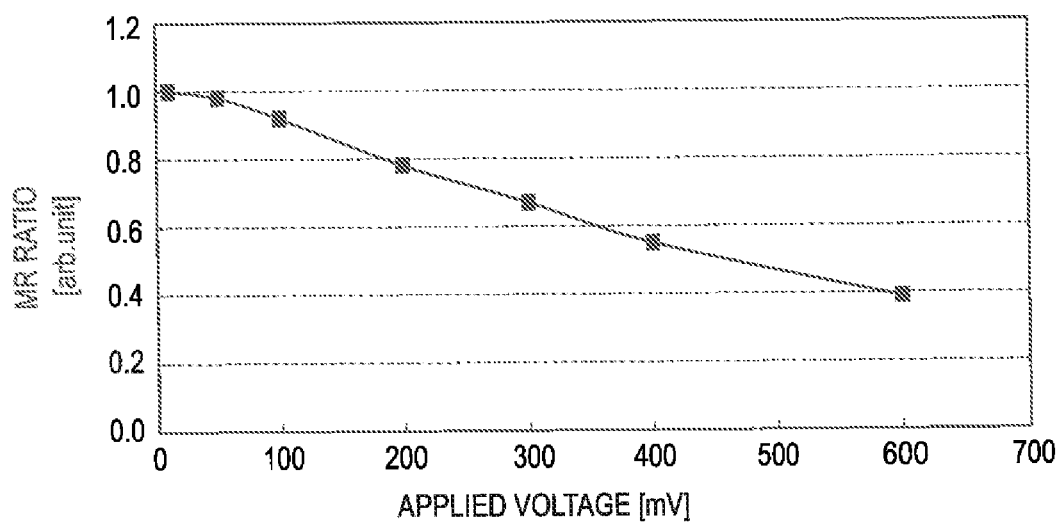
FIG. 24 is a characteristic view showing voltage dependency of an MR ratio of TMR elements.
Figure 25:
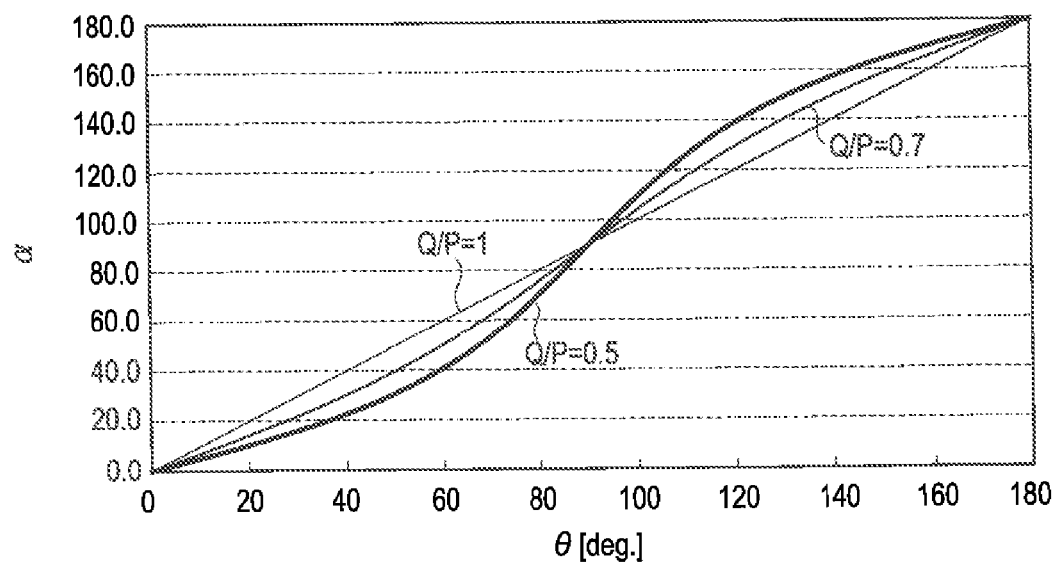
FIG. 25 is a correlation chart showing a relation among a parameter Q/P showing a distribution of a field generated by the magnetic movable body, a phase angle θ, and an applied field angle α in magnetic position detection devices of the invention.
Figure 26:
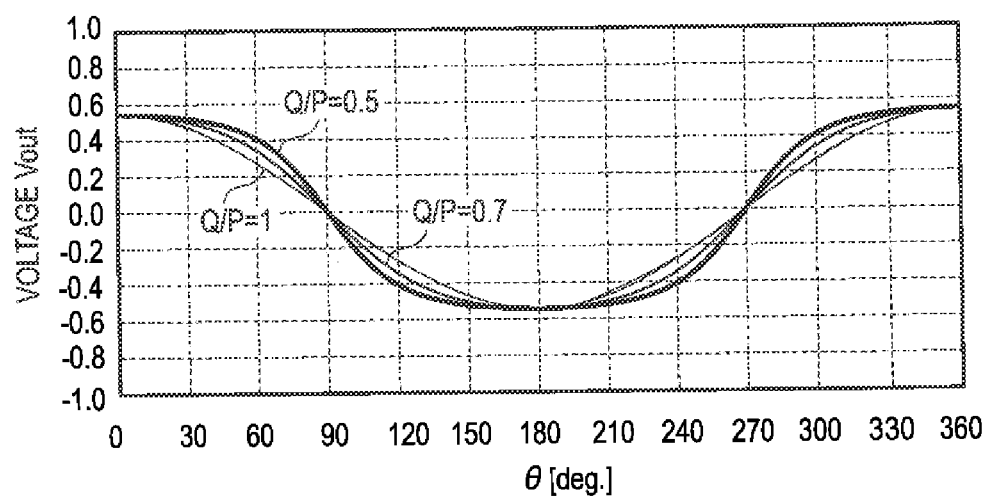
FIG. 26 is a waveform chart showing an output due to a movement of a magnetic movable body in the magnetic position detection device in the related art.

FIG. 19 shows the advantages of the magnetic position detection device 100 of the invention in comparison with the magnetic position detection device in the related art. Herein, a distribution of the field generated by the magnetic movable body 10 is given as: Q/P=0.7. The embodiment in the related art is the embodiment described as the comparative embodiment of the first embodiment above. By defining that a distortion of the waveform of the differential output Vout of the bridge circuit (an amplitude of a difference signal between a differential output Vout and "the cosine wave") of this embodiment is 1, the drawing shows normalized distortions of the output waveforms of the respective embodiments of the invention. Compared herein are the embodiment without the correction circuit of the second embodiment, the second embodiment, the embodiment without the correction circuits of the third embodiment, and the third embodiment. It is understood that the respective embodiments of the invention have the advantages of reducing a distortion of the output waveform. In the third embodiment, a distortion of the output waveform is reduced to about 1/10 in comparison with that in the comparative embodiment. Hence, according to the invention, it becomes possible to provide the magnetic position detection device 100 capable of effectively reducing a distortion of an output waveform due to a distribution of the field generated by the magnetic movable body 10 and voltage dependency of an MR ratio of the TMR elements 3T and therefore obtaining precise position information at a high degree of accuracy.

Magnetic Movable Body 10

The magnetic movable body 10 forming the magnetic position detection device 100 of the invention can be any movable body as long as it is formed of a magnetized magnetic body on which N-poles and S-poles alternately appear for the opposing field sensor 1. A bipolar type is also available. Also, the above has described those of a rectangular shape (FIG. 1) and a ring shape (FIG. 2). However, those of a cylindrical shape or a spherical shape are also available. A distribution of the generated field, Q/P, is not limited, either, and it is normally in the range of 0.5 to 1.

Magneto-Resistance Element 3

As has been described above, a spin-valve MR element is used as the electromagnetic conversion elements forming the magnetic position detection device 100 of the invention. In particular, the TMR elements 3T having a large MR ratio among the spin-valve MR elements are used in the bridge circuits 20, 21, and 22 forming the magnetic position detection device 100 of the invention. Alternatively, MR elements other than the TMR elements 3T may be used in the correction circuits 30, 31, and 32 forming the magnetic position detection device 100 of the invention. For example, GMR elements are also available.

As is shown in FIG. 2, the magnetic position detection device 100 of the invention is also used to detect a rotational angle of a rotating body. This device is suitable to detect an angle of the axis of rotation of a motor. This device is extensively applicable as in-vehicle devices, for example, as an angle detection device represented by a steering angle sensor. In terms of the configuration of the device, the invention is effective in a case where an end of the axis of rotation is inaccessible and is also characterized by its competitiveness with resolver techniques.

It should be understood that embodiments disclosed herein are mere examples in their entirety and are not restrictive. For example, regarding the distances defined as λ and L above or parameters n and m determining the distances, as long as the advantages described herein can be obtained, approximate values to those specified above can be handled equivalently. The same applies also to directions, such as a movement direction of the magnetic movable body 10 and a magnetization direction of the TMR elements 3T, or characteristic values, such as the electrical resistance values of the field detection portion 2 and the TMR elements 3T. It should be appreciated that the scope of the invention is specified not by the above description but by the appended claims and meanings equivalent to the scope of the claims and all modifications within the scope are included in the invention.

The respective embodiments of the invention can be combined without restriction and can be modified or omitted as the need arises within the scope of the invention.

The invention claimed is:

1. A magnetic position detection device, characterized by comprising:
   a magnetic movable body formed of a magnetic body, magnetized so that N-poles and S-poles alternately appear, and having a region in which distances between the N-poles and the S-poles are constant; and
   first through sixth field detection portions each having an electrical resistance value that varies with a change in a field in association with a movement of the magnetic movable body, wherein:
   the first through sixth field detection portions are formed of magneto-resistance elements each having a spin-valve structure and including a magnetization fixed layer in which a magnetization direction with respect to an applied field is fixed, a magnetization free layer in which a magnetization direction varies with the applied field, and a non-magnetic intermediate layer sandwiched between the magnetization fixed layer and the magnetization free layer;
   the magneto-resistance elements forming the first through fourth field detection portions are tunneling magneto-resistance elements in which the intermediate layers are an insulator;
   the magnetization directions of the magnetization fixed layers of the respective magneto-resistance elements forming the first through sixth field detection portions are all in a same direction with respect to a movement direction of the magnetic movable body;
   the first and third field detection portions are located at a detection position in a region A;
   the second and fourth field detection portions are located at a detection position in a region B;
   the fifth field detection portion is located at a detection position in a region C;
   the sixth field detection portion is located at a detection position in a region D;
   the following relations are satisfied,
      a distance L(A-B) between the detection positions in the region A and the region B with respect to a constant distance λ between an N-pole and another N-pole or between an S-pole and another S-pole of the magnetic movable body is expressed as:

$L(A\text{-}B)=L=\lambda/n$, the region C is located between the region A and the region B and a distance L(A-C) between the detection positions in the region A and the region C is expressed as:

$L(A\text{-}C)=L/m=\lambda/(mn)$, and the region D is located away from the region C in a direction of the region B and a distance L(C-D) between the detection positions in the region C and the region D is expressed as:

$L(C\text{-}D)=\lambda/2$, where n is a natural number equal to or greater than 2 and m is a natural number;
   a first parallel-connected body formed of the serially-connected first and second field detection portions and the serially-connected third and fourth field detection portions and a second parallel-connected body formed of the fifth and sixth field detection portions are connected in series between a first reference potential and a second reference potential; and
   a signal corresponding to a movement of the magnetic movable body is outputted on the basis of a difference Vout between a midpoint potential V1 of the first and a second field detection portions and a midpoint potential V2 of the third and fourth field detection portions.

2. The magnetic position detection device according to claim 1, characterized in that:
   a relation expressed as: m=n is satisfied.

3. The magnetic position detection device according to claim 1, characterized in that:

the magneto-resistance elements forming the fifth and sixth field detection portions are tunneling magneto-resistance elements in which the intermediate layers are an insulator.

4. The magnetic position detection device according to claim 1, characterized in that:
the magneto-resistance elements forming the fifth and sixth field detection portions are giant magneto-resistance elements in which the intermediate layers are a non-magnetic metal body.

5. The magnetic position detection device according to claim 1, characterized in that:
the fifth and sixth field detection portions are formed so as to have electric resistance values equal to each other when angles yielded between the magnetization directions of the magnetization fixed layers and the magnetization directions of the magnetization free layers of the magneto-resistance elements forming the field detection portions are equal.

6. The magnetic position detection device according to claim 5, characterized in that:
the first through fourth field detection portions are formed so as to have electric resistance values equal to one another, and an electrical resistance value R5 of the fifth magnetic field detection portion satisfies a relation with respect to an electrical resistance value R1 of the first field detection portion expressed as: 0<R5/R1≤1, when angles yielded between the magnetization directions of the magnetization fixed layers and the magnetization directions of the magnetization free layers of the magneto-resistance elements forming the field detection portions are equal.

7. A magnetic position detection device characterized by comprising:
a magnetic movable body formed of a magnetic body, magnetized so that N-poles and S-poles alternately appear, and having a region in which distances between the N-poles and the S-poles are constant; and
first through twelfth field detection portions each having an electrical resistance value that varies with a change in a field in association with a movement of the magnetic movable body,
wherein:
the first through twelfth field detection portions are formed of magneto-resistance elements each having a spin-valve structure and including a magnetization fixed layer in which a magnetization direction with respect to an applied field is fixed, a magnetization free layer in which a magnetization direction varies with the applied field, and a non-magnetic intermediate layer sandwiched between the magnetization fixed layer and the magnetization free layer;
the magneto-resistance elements forming the first through fourth field detection portions and the magneto-resistance elements forming the seventh through tenth field detection portions are tunneling magneto-resistance elements in which the intermediate layers are an insulator;
the magnetization directions of the magnetization fixed layers of the respective magneto-resistance elements forming the first through twelfth field detection portions are all in a same direction with respect to a movement direction of the magnetic movable body;
the first and third field detection portions are located at a detection position in a region A;
the second and fourth field detection portions are located at a detection position in a region B;
the fifth field detection portion is located at a detection position in a region C;
the sixth field detection portion is located at a detection position in a region D;
the seventh and ninth field detection portions are located at a detection position in a region E;
the eighth and tenth field detection portions are located at a detection position in a region F;
the eleventh field detection portion is located at a detection position in a region G;
the twelfth field detection portion is located at a detection position in a region H;
the following relations are satisfied,
a distance L (A-B) between the detection positions in the region A and the region B with respect to a constant distance λ between an N-pole and another N-pole or between an S-pole and another S-pole of the magnetic movable body is expressed as:

$L(A-B)=L1=\lambda/n1$, the region C is located between the region A and the region B and a distance L(A-C) between the detection positions in the region A and the region C is expressed as:

$L(A-C)=L1/m1=\lambda/(m1n1)$, the region D is located away from the region C in a direction of the region B and a distance L(C-D) between the detection positions in the region C and the region D is expressed as:

$L(C-D)=\lambda/2$, the region E is located away from the region A in the direction of the region B and a distance L(A-E) between the detection positions in the region A and the region E is expressed as:

$L(A-E)=L2=\lambda/n2$, the region F is located away from the region E in a direction of the region D and a distance L(E-F) between the detection positions in the region E and the region F is expressed as:

$L(E-F)=L1=\lambda/n1$, the region G is located between the region E and the region F and a distance L(E-G) between the detection positions in the region E and the region G is expressed as:

$L(E-G)=L1/m2=a/(m2n1)$, and the region H is located away from the region G in a direction of the region F and a distance L(G-H) between the detection positions in the region G and the region H is expressed as:

$L(G-H)=\lambda/2$, where n1 and n2 are natural numbers equal to or greater than 2 and m1 and m2 are natural numbers;
a first parallel-connected body formed of the serially-connected first and second field detection portions and the serially-connected third and fourth field detection portions and a second parallel-connected body formed of the fifth and sixth field detection portions are connected in series between a first reference potential and a second reference potential;
a third parallel-connected body formed of the serially-connected seventh and eighth field detection portions and the serially-connected ninth and tenth field detection portions and a fourth parallel-connected body formed of the eleventh and twelfth field detection portions are connected in series between a third reference potential and a fourth reference potential; and a signal corresponding to a movement of the magnetic movable body is outputted based on a difference Vout between a difference V12, which is a difference between a midpoint potential V1 of the first and second field detection portions and a midpoint potential V2 of the third and fourth field detection portions, and a difference V34, which is a difference between a midpoint potential V3 of the seventh and eighth field detection portions and a midpoint potential V4 of the ninth and tenth field detection portions.

8. The magnetic position detection device according to claim 7, characterized in that:

relations expressed as: $n2 \neq n1$ and $m1 = n1$ are satisfied.

9. The magnetic position detection device according to claim 8, characterized in that:

relations expressed as: $n1 > n2$ and $m2 = n2$ are satisfied.

10. The magnetic position detection device according to claim 7, characterized in that:

the magneto-resistance elements forming the fifth and sixth field detection portions and the eleventh and twelfth field detection portions are tunneling magneto-resistance elements in which the intermediate layers are an insulator.

11. The magnetic position detection device according to claim 7, characterized in that:

the magneto-resistance elements forming the fifth and sixth field detection portions and the eleventh and twelfth field detection portions are giant magneto-resistance elements in which the intermediate layers are a non-magnetic metal body.

12. The magnetic position detection device according to claim 11, characterized in that:

the first through fourth field detection portions are formed so as to have electrical resistance values equal to one another, the seventh through tenth field detection portions are formed so as to have electrical resistance values equal to one another, an electrical resistance value R5 of the fifth field detection portion satisfies a relation with respect to an electrical resistance value R1 of the first field detection portion expressed as: $0 < R5/R1 \leq 1$, and an electrical resistance value R11 of the eleventh field detection portion satisfies a relation with respect to an electrical resistance value R7 of the seventh field detection portion expressed as: $0 < R11/R7 \leq 1$, when angles yielded between the magnetization directions of the magnetization fixed layers and the magnetization directions of the magnetization free layers of the magneto-resistance elements forming the field detection portions are equal.

13. The magnetic position detection device according to claim 7, characterized in that:

the fifth and sixth field detection portions are formed so as to have electrical resistance values equal to each other and the eleventh and twelfth field detection portions are formed so as to have electrical resistance values equal to each other when angles yielded between the magnetization directions of the magnetization fixed layers and the magnetization directions of the magnetization free layers of the magneto-resistance elements forming the field detection portions are equal.

* * * * *